United States Patent
Varadarajan et al.

(10) Patent No.: US 12,334,332 B2
(45) Date of Patent: Jun. 17, 2025

(54) REMOTE PLASMA BASED DEPOSITION OF SILICON CARBIDE FILMS USING SILICON-CONTAINING AND CARBON-CONTAINING PRECURSORS

(71) Applicant: Lam Research Corporation, Fremont, CA (US)

(72) Inventors: Bhadri N. Varadarajan, Beaverton, OR (US); Matthew Scott Weimer, Chicago, IL (US); Galbokka Hewage Layan Savithra, Lake Oswego, OR (US); Bo Gong, Sherwood, OR (US); Zhe Gui, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 724 days.

(21) Appl. No.: 16/044,371

(22) Filed: Jul. 24, 2018

(65) Prior Publication Data
US 2018/0330945 A1    Nov. 15, 2018

Related U.S. Application Data

(63) Continuation-in-part of application No. 14/616,435, filed on Feb. 6, 2015, which is a continuation-in-part
(Continued)

(51) Int. Cl.
*H01L 21/02* (2006.01)
*C23C 16/04* (2006.01)
(Continued)

(52) U.S. Cl.
CPC ...... *H01L 21/02167* (2013.01); *C23C 16/045* (2013.01); *C23C 16/325* (2013.01);
(Continued)

(58) Field of Classification Search
CPC ............ C23C 16/325; C23C 16/345; C23C 16/401–402; C23C 16/452;
(Continued)

(56) References Cited

U.S. PATENT DOCUMENTS

| 4,532,150 A | 7/1985 | Endo et al. |
| 4,952,658 A | 8/1990 | Kalchauer et al. |

(Continued)

FOREIGN PATENT DOCUMENTS

| CN | 1609156 A | 4/2005 |
| CN | 1714168 A | 12/2005 |

(Continued)

OTHER PUBLICATIONS

Bishop, C. Vacuum Deposition onto Webs, Films and Foils, Elsevier (2011) 2nd Edition Chapter 19 p. 331 (Year: 2011).*
(Continued)

*Primary Examiner* — Brigitte A Paterson
(74) *Attorney, Agent, or Firm* — Weaver Austin Villeneuve & Sampson LLP

(57) ABSTRACT

A doped or undoped silicon carbide film can be deposited using a remote plasma chemical vapor deposition (CVD) technique. One or more silicon-containing precursors are provided to a reaction chamber. Radical species, such as hydrogen radical species, are provided in a substantially low energy state or ground state and interact with the one or more silicon-containing precursors to deposit the silicon carbide film. A co-reactant may be flowed with the one or more silicon-containing precursors, where the co-reactant is a carbon-containing precursor and each silicon-containing precursor is a silane-based precursor with at least a silicon atom having two or more hydrogen atoms bonded to the silicon atom.

18 Claims, 10 Drawing Sheets

Related U.S. Application Data of application No. 13/494,836, filed on Jun. 12, 2012, and a continuation-in-part of application No. 13/907,699, filed on May 31, 2013, now Pat. No. 9,234,276.

(51) Int. Cl.

| | |
|---|---|
| *C23C 16/32* | (2006.01) |
| *C23C 16/452* | (2006.01) |
| *C23C 16/52* | (2006.01) |
| *H01L 21/768* | (2006.01) |
| *H01L 29/49* | (2006.01) |
| *H01L 29/78* | (2006.01) |
| *H10D 64/66* | (2025.01) |
| *H10D 30/60* | (2025.01) |

(52) U.S. Cl.
CPC ............ *C23C 16/452* (2013.01); *C23C 16/52* (2013.01); *H01L 21/02126* (2013.01); *H01L 21/02211* (2013.01); *H01L 21/02216* (2013.01); *H01L 21/02222* (2013.01); *H01L 21/02274* (2013.01); *H01L 21/76831* (2013.01); *H01L 21/76834* (2013.01); *H10D 64/671* (2025.01); *H10D 64/679* (2025.01); *H01L 21/7682* (2013.01); *H01L 2221/1047* (2013.01); *H10D 30/60* (2025.01)

(58) Field of Classification Search
CPC ....... C23C 16/50–517; H01L 21/02126; H01L 21/0214; H01L 21/02208–0222; H01L 21/02274
See application file for complete search history.

(56) References Cited

U.S. PATENT DOCUMENTS

| | | |
|---|---|---|
| 5,122,431 A | 6/1992 | Kodama et al. |
| 5,447,816 A | 9/1995 | Kodama et al. |
| 5,518,572 A | 5/1996 | Kinoshita et al. |
| 5,567,243 A | 10/1996 | Foster et al. |
| 5,807,615 A | 9/1998 | Sindzingre et al. |
| 6,013,155 A | 1/2000 | McMillin et al. |
| 6,262,445 B1 | 7/2001 | Swanson et al. |
| 6,365,527 B1 | 4/2002 | Yang et al. |
| 6,383,299 B1 | 5/2002 | Yuda et al. |
| 6,395,150 B1 | 5/2002 | Van Cleemput et al. |
| 6,447,186 B1 | 9/2002 | Oguchi et al. |
| 6,448,186 B1 | 9/2002 | Olson et al. |
| 6,576,345 B1 | 6/2003 | Van Cleemput et al. |
| 6,624,064 B1 | 9/2003 | Sahin et al. |
| 6,713,390 B2 | 3/2004 | M'Saad et al. |
| 6,790,788 B2 | 9/2004 | Li et al. |
| 6,846,391 B1 | 1/2005 | Papasouliotis et al. |
| 6,846,745 B1 | 1/2005 | Papasouliotis et al. |
| 6,849,561 B1 | 2/2005 | Goundar |
| 6,851,384 B2 | 2/2005 | Yuda et al. |
| 6,890,850 B2 | 5/2005 | Lee et al. |
| 6,919,270 B2 | 7/2005 | Satoh et al. |
| 6,935,553 B2 | 8/2005 | Suga et al. |
| 6,949,450 B2 | 9/2005 | Chiang et al. |
| 6,991,959 B2 | 1/2006 | Goundar et al. |
| 7,163,896 B1 | 1/2007 | Zhu et al. |
| 7,256,139 B2 | 8/2007 | Moghadam et al. |
| 7,514,375 B1 | 4/2009 | Shanker et al. |
| 7,524,735 B1 | 4/2009 | Gauri et al. |
| 7,582,555 B1 | 9/2009 | Lang et al. |
| 7,622,400 B1 | 11/2009 | Fox et al. |
| 7,648,899 B1 | 1/2010 | Banerji et al. |
| 7,662,355 B2 | 2/2010 | Kamisako et al. |
| 7,695,765 B1 | 4/2010 | Fox et al. |
| 7,709,063 B2 | 5/2010 | Yuda et al. |
| 7,736,728 B2 | 6/2010 | Loboda et al. |
| 7,915,166 B1 | 3/2011 | Yu et al. |
| 8,021,992 B2 | 9/2011 | Liou et al. |
| 8,053,372 B1 | 11/2011 | Greer et al. |
| 8,084,339 B2 | 12/2011 | Antonelli et al. |
| 8,168,268 B2 | 5/2012 | Ovshinsky |
| 8,178,168 B2 | 5/2012 | O'Neill et al. |
| 8,217,513 B2 | 7/2012 | Antonelli et al. |
| 8,864,935 B2 | 10/2014 | Fair et al. |
| 8,916,022 B1 | 12/2014 | Caron |
| 8,927,442 B1 | 1/2015 | Angyal et al. |
| 9,234,276 B2 | 1/2016 | Varadarajan et al. |
| 9,371,579 B2 | 6/2016 | Varadarajan et al. |
| 9,382,268 B1 | 7/2016 | Kuchenbeiser et al. |
| 9,391,086 B1 | 7/2016 | Soda et al. |
| 9,591,738 B2 | 3/2017 | Qiu et al. |
| 9,837,270 B1 | 12/2017 | Varadarajan et al. |
| 10,002,787 B2 | 5/2018 | Yu et al. |
| 10,211,310 B2 | 2/2019 | Varadarajan et al. |
| 10,297,442 B2 | 5/2019 | Varadarajan et al. |
| 10,325,773 B2 | 6/2019 | Varadarajan et al. |
| 10,472,714 B2 | 11/2019 | Varadarajan |
| 10,580,690 B2 | 3/2020 | Yu et al. |
| 10,832,904 B2 | 11/2020 | Varadarajan |
| 10,840,087 B2 | 11/2020 | Weimer et al. |
| 11,049,716 B2 | 6/2021 | Tang et al. |
| 11,264,234 B2 | 3/2022 | Varadarajan et al. |
| 11,680,314 B2 | 6/2023 | Varadarajan |
| 11,680,315 B2 | 6/2023 | Varadarajan |
| 11,708,634 B2 | 7/2023 | Varadarajan |
| 11,732,350 B2 | 8/2023 | Varadarajan |
| 11,848,199 B2 | 12/2023 | Yuan et al. |
| 11,894,227 B2 | 2/2024 | Varadarajan et al. |
| 2001/0012667 A1 | 8/2001 | Ma et al. |
| 2002/0000202 A1 | 1/2002 | Yuda et al. |
| 2002/0039625 A1 | 4/2002 | Powell et al. |
| 2002/0106891 A1 | 8/2002 | Kim et al. |
| 2002/0132101 A1 | 9/2002 | Fonash et al. |
| 2003/0008528 A1 | 1/2003 | Xia et al. |
| 2003/0036272 A1 | 2/2003 | Shamouilian et al. |
| 2003/0064154 A1 | 4/2003 | Laxman et al. |
| 2003/0113995 A1 | 6/2003 | Xia et al. |
| 2003/0139035 A1* | 7/2003 | Yim .................. H01L 21/76829 438/643 |
| 2003/0154141 A1 | 8/2003 | Capazario et al. |
| 2003/0176030 A1 | 9/2003 | Tsuji et al. |
| 2003/0194496 A1 | 10/2003 | Xu et al. |
| 2003/0232504 A1 | 12/2003 | Eppler et al. |
| 2004/0050328 A1 | 3/2004 | Kumagai et al. |
| 2004/0067308 A1 | 4/2004 | Zheng et al. |
| 2004/0084680 A1 | 5/2004 | Ruelke et al. |
| 2004/0086434 A1 | 5/2004 | Gadgil et al. |
| 2004/0089924 A1 | 5/2004 | Yuasa et al. |
| 2004/0115876 A1 | 6/2004 | Goundar et al. |
| 2004/0115954 A1 | 6/2004 | Todd |
| 2004/0121085 A1 | 6/2004 | Wang et al. |
| 2004/0161535 A1 | 8/2004 | Goundar et al. |
| 2004/0180557 A1 | 9/2004 | Park et al. |
| 2004/0194706 A1 | 10/2004 | Wang et al. |
| 2004/0197474 A1 | 10/2004 | Vrtis et al. |
| 2004/0232552 A1 | 11/2004 | Wang et al. |
| 2004/0253777 A1 | 12/2004 | Miyoshi et al. |
| 2005/0014315 A1 | 1/2005 | Yamamoto et al. |
| 2005/0100682 A1 | 5/2005 | Fukiage et al. |
| 2005/0130404 A1 | 6/2005 | Moghadam et al. |
| 2005/0202685 A1 | 9/2005 | Huang et al. |
| 2005/0211170 A1 | 9/2005 | Hanawa et al. |
| 2005/0230831 A1 | 10/2005 | Clevenger et al. |
| 2005/0255714 A1 | 11/2005 | Iyer et al. |
| 2005/0287790 A1 | 12/2005 | Owada et al. |
| 2005/0287811 A1 | 12/2005 | Inukai |
| 2006/0014384 A1 | 1/2006 | Lee et al. |
| 2006/0014399 A1 | 1/2006 | Joe |
| 2006/0046520 A1 | 3/2006 | Padhi et al. |
| 2006/0091559 A1 | 5/2006 | Nguyen et al. |
| 2006/0160376 A1 | 7/2006 | Padhi et al. |
| 2006/0216916 A1 | 9/2006 | Tsai et al. |
| 2006/0252273 A1 | 11/2006 | Lakshmanan et al. |
| 2006/0273319 A1 | 12/2006 | Dairiki et al. |
| 2006/0278952 A1 | 12/2006 | Mori et al. |
| 2007/0004204 A1 | 1/2007 | Fukazawa et al. |
| 2007/0141812 A1 | 6/2007 | Zagwijn et al. |

(56) References Cited

U.S. PATENT DOCUMENTS

| | | |
|---|---|---|
| 2007/0173071 A1 | 7/2007 | Afzali-Ardakani et al. |
| 2007/0190266 A1 | 8/2007 | Fu |
| 2007/0281496 A1 | 12/2007 | Ingle et al. |
| 2008/0064173 A1 | 3/2008 | Hung |
| 2008/0090022 A1 | 4/2008 | Ovshinsky |
| 2008/0132087 A1 | 6/2008 | Xia et al. |
| 2008/0156264 A1 | 7/2008 | Fair et al. |
| 2008/0178805 A1 | 7/2008 | Paterson et al. |
| 2008/0217746 A1 | 9/2008 | Morita et al. |
| 2008/0233366 A1 | 9/2008 | Edelstein et al. |
| 2008/0277765 A1 | 11/2008 | Lane et al. |
| 2009/0017227 A1 | 1/2009 | Fu et al. |
| 2009/0017640 A1 | 1/2009 | Huh et al. |
| 2009/0042402 A1 | 2/2009 | Morioka |
| 2009/0082240 A1 | 3/2009 | Nukui et al. |
| 2009/0093132 A1 | 4/2009 | Xu et al. |
| 2009/0095334 A1 | 4/2009 | Huston |
| 2009/0218699 A1 | 9/2009 | Torres et al. |
| 2009/0258487 A1 | 10/2009 | Lin et al. |
| 2009/0264277 A1 | 10/2009 | Raj et al. |
| 2009/0325364 A1 | 12/2009 | Sasagawa et al. |
| 2010/0025370 A1* | 2/2010 | Dieguez-Campo ............ H01J 37/3244 216/67 |
| 2010/0075077 A1 | 3/2010 | Bicker et al. |
| 2010/0081293 A1 | 4/2010 | Mallick et al. |
| 2010/0099264 A1 | 4/2010 | Elers |
| 2010/0136789 A1 | 6/2010 | Matz et al. |
| 2010/0181654 A1 | 7/2010 | Fujiwara et al. |
| 2010/0207274 A1 | 8/2010 | Hayashi et al. |
| 2010/0224322 A1 | 9/2010 | Sui et al. |
| 2010/0255667 A1 | 10/2010 | Seino et al. |
| 2010/0308463 A1 | 12/2010 | Yu et al. |
| 2010/0317198 A1 | 12/2010 | Antonelli et al. |
| 2011/0027957 A1 | 2/2011 | Berry |
| 2011/0045676 A1 | 2/2011 | Park et al. |
| 2011/0074044 A1 | 3/2011 | Lin et al. |
| 2011/0111533 A1 | 5/2011 | Varadarajan et al. |
| 2011/0114994 A1 | 5/2011 | Mandlik et al. |
| 2011/0117678 A1 | 5/2011 | Varadarajan et al. |
| 2011/0146568 A1 | 6/2011 | Haukka et al. |
| 2011/0180866 A1 | 7/2011 | Matsuda et al. |
| 2011/0193230 A1 | 8/2011 | Nogami et al. |
| 2011/0204492 A1 | 8/2011 | Xie et al. |
| 2011/0217844 A1 | 9/2011 | Satou |
| 2011/0236594 A1 | 9/2011 | Haverkamp et al. |
| 2011/0244694 A1 | 10/2011 | Antonelli et al. |
| 2011/0256726 A1 | 10/2011 | LaVoie et al. |
| 2012/0009802 A1 | 1/2012 | LaVoie et al. |
| 2012/0077349 A1 | 3/2012 | Li et al. |
| 2012/0080779 A1 | 4/2012 | Seamons et al. |
| 2012/0119283 A1 | 5/2012 | Lee et al. |
| 2012/0122302 A1 | 5/2012 | Weidman et al. |
| 2012/0142172 A1 | 6/2012 | Fox et al. |
| 2012/0149213 A1 | 6/2012 | Nittala et al. |
| 2012/0214318 A1* | 8/2012 | Fukazawa ............ H01L 21/0217 438/786 |
| 2012/0282756 A1 | 11/2012 | Meng |
| 2012/0329287 A1 | 12/2012 | Gates et al. |
| 2013/0008378 A1 | 1/2013 | Antonelli et al. |
| 2013/0043514 A1 | 2/2013 | Grill et al. |
| 2013/0056818 A1 | 3/2013 | Iino et al. |
| 2013/0075455 A1 | 3/2013 | Shimizu |
| 2013/0084711 A1 | 4/2013 | Liang et al. |
| 2013/0119406 A1 | 5/2013 | Notsu et al. |
| 2013/0129940 A1 | 5/2013 | Xiao et al. |
| 2013/0183835 A1 | 7/2013 | Nguyen et al. |
| 2013/0217239 A1 | 8/2013 | Mallick et al. |
| 2013/0242493 A1 | 9/2013 | Shenoy et al. |
| 2013/0298942 A1 | 11/2013 | Ren et al. |
| 2013/0319290 A1 | 12/2013 | Xiao et al. |
| 2013/0330932 A1 | 12/2013 | Rangarajan et al. |
| 2013/0330935 A1 | 12/2013 | Varadarajan |
| 2014/0132466 A1 | 5/2014 | Inoue et al. |
| 2014/0134827 A1 | 5/2014 | Swaminathan et al. |
| 2014/0191365 A1 | 7/2014 | Barabash et al. |
| 2014/0197470 A1 | 7/2014 | Lee et al. |
| 2014/0264780 A1 | 9/2014 | Yim et al. |
| 2014/0264925 A1 | 9/2014 | Chen |
| 2014/0302690 A1 | 10/2014 | Underwood et al. |
| 2014/0356549 A1 | 12/2014 | Varadarajan |
| 2015/0016085 A1 | 1/2015 | Natsumeda et al. |
| 2015/0110968 A1 | 4/2015 | LaVoie et al. |
| 2015/0118394 A1 | 4/2015 | Varadarajan et al. |
| 2015/0179466 A1 | 6/2015 | Takayama et al. |
| 2015/0214015 A1 | 7/2015 | Kikuchi et al. |
| 2015/0249007 A1 | 9/2015 | Xiao et al. |
| 2015/0303056 A1 | 10/2015 | Varadarajan et al. |
| 2015/0329965 A1 | 11/2015 | Gadgil et al. |
| 2016/0020089 A1 | 1/2016 | Thadani et al. |
| 2016/0090649 A1 | 3/2016 | Varadarajan |
| 2016/0268286 A1 | 9/2016 | Tamura |
| 2016/0276140 A1 | 9/2016 | Varadarajan et al. |
| 2016/0284615 A1 | 9/2016 | Kitajima et al. |
| 2016/0314964 A1 | 10/2016 | Tang et al. |
| 2016/0358804 A1 | 12/2016 | Kulshreshtha et al. |
| 2017/0062218 A1 | 3/2017 | Duan et al. |
| 2017/0140924 A1 | 5/2017 | Suzuki et al. |
| 2017/0140925 A1 | 5/2017 | Suzuki et al. |
| 2017/0221718 A1 | 8/2017 | Tapily |
| 2017/0365462 A1 | 12/2017 | Varadarajan et al. |
| 2017/0372919 A1 | 12/2017 | Manna et al. |
| 2018/0033614 A1 | 2/2018 | Chandra et al. |
| 2018/0061636 A1 | 3/2018 | Li et al. |
| 2018/0096842 A1 | 4/2018 | Varadarajan |
| 2018/0144977 A1 | 5/2018 | Yu et al. |
| 2018/0202042 A1 | 7/2018 | Fafard et al. |
| 2018/0240664 A9 | 8/2018 | Varadarajan et al. |
| 2018/0247858 A1 | 8/2018 | Nakaya et al. |
| 2018/0330939 A1 | 11/2018 | Pore |
| 2018/0330945 A1 | 11/2018 | Varadarajan et al. |
| 2018/0330985 A1 | 11/2018 | Yu et al. |
| 2018/0347035 A1 | 12/2018 | Weimer et al. |
| 2019/0181004 A1 | 6/2019 | Tang et al. |
| 2019/0259604 A1 | 8/2019 | Varadarajan et al. |
| 2019/0382885 A1 | 12/2019 | Varadarajan |
| 2020/0027725 A1 | 1/2020 | Weimer et al. |
| 2021/0391171 A1 | 12/2021 | Yuan et al. |
| 2022/0098727 A1 | 3/2022 | Varadarajan |
| 2022/0148875 A1 | 5/2022 | Varadarajan et al. |
| 2022/0220608 A1 | 7/2022 | Varadarajan |
| 2022/0220609 A1 | 7/2022 | Varadarajan |
| 2022/0220610 A1 | 7/2022 | Varadarajan |
| 2022/0220611 A1 | 7/2022 | Varadarajan |
| 2022/0238333 A1 | 7/2022 | Yuan et al. |
| 2022/0238334 A1 | 7/2022 | Yuan et al. |
| 2023/0203646 A1 | 6/2023 | Weimer et al. |
| 2024/0063015 A1 | 2/2024 | Yuan et al. |
| 2024/0145234 A1 | 5/2024 | Varadarajan et al. |

FOREIGN PATENT DOCUMENTS

| | | |
|---|---|---|
| CN | 1735945 A | 2/2006 |
| CN | 101017834 A | 8/2007 |
| CN | 101065834 A | 10/2007 |
| CN | 102171796 A | 8/2011 |
| CN | 102187450 A | 9/2011 |
| CN | 102468283 A | 5/2012 |
| CN | 102468434 A | 5/2012 |
| CN | 102652353 A | 8/2012 |
| CN | 102892922 A | 1/2013 |
| CN | 103168344 A | 6/2013 |
| CN | 104561934 A | 4/2015 |
| CN | 105185707 A | 12/2015 |
| CN | 105862010 A | 8/2016 |
| CN | 106024673 A | 10/2016 |
| CN | 106067440 A | 11/2016 |
| CN | 106711025 A | 5/2017 |
| CN | 107667187 A | 2/2018 |
| CN | 107833825 A | 3/2018 |
| CN | 108028179 A | 5/2018 |
| CN | 108140545 A | 6/2018 |
| CN | 108504996 A | 9/2018 |
| CN | 108603287 A | 9/2018 |

(56) References Cited

FOREIGN PATENT DOCUMENTS

| | | | |
|---|---|---|---|
| CN | 109791871 | A | 5/2019 |
| EP | 1164628 | A2 | 12/2001 |
| JP | 2004006332 | A | 1/2004 |
| JP | 2005-051096 | A | 2/2005 |
| JP | 2006351694 | A | 12/2006 |
| JP | 2007194639 | A | 8/2007 |
| JP | 2009295617 | A | 12/2009 |
| JP | 2013102174 | A | 5/2013 |
| JP | 2017092475 | A | 5/2017 |
| JP | 2020502797 | A | 1/2020 |
| KR | 20010112652 | A | 12/2001 |
| KR | 2002-0058594 | A | 7/2002 |
| KR | 20030007721 | A | 1/2003 |
| KR | 2004-0036551 | A | 4/2004 |
| KR | 2004-0068586 | A | 7/2004 |
| KR | 2005-0002525 | A | 1/2005 |
| KR | 20080110967 | A | 12/2008 |
| KR | 2009-0019865 | A | 2/2009 |
| KR | 2009-0106112 | A | 10/2009 |
| KR | 20110021743 | A | 3/2011 |
| KR | 2011-0082025 | A | 7/2011 |
| KR | 10-2011-0093251 | A | 8/2011 |
| KR | 20110094205 | A | 8/2011 |
| KR | 2011-0134521 | A | 12/2011 |
| KR | 101122458 | B1 | 2/2012 |
| KR | 20120053003 | A | 5/2012 |
| KR | 20120053331 | A | 5/2012 |
| KR | 2012-0060781 | A | 6/2012 |
| KR | 20120132403 | A | 12/2012 |
| KR | 2013-0032343 | | 4/2013 |
| KR | 20130062256 | A | 6/2013 |
| KR | 10-1334640 | B1 | 11/2013 |
| KR | 20130139188 | A | 12/2013 |
| KR | 20140114047 | A | 9/2014 |
| KR | 20140141533 | A | 12/2014 |
| KR | 20150047439 | A | 5/2015 |
| KR | 20150072342 | A | 6/2015 |
| KR | 20150079495 | A | 7/2015 |
| KR | 20160016712 | A | 2/2016 |
| KR | 20160061002 | A | 5/2016 |
| KR | 20160095631 | A | 8/2016 |
| KR | 20160097149 | A | 8/2016 |
| KR | 20160125310 | A | 10/2016 |
| KR | 20180035929 | A | 4/2018 |
| KR | 20180043393 | A | 4/2018 |
| KR | 2018-0099476 | A | 9/2018 |
| TW | 261689 | B | 11/1995 |
| TW | 476807 | B | 2/2002 |
| TW | 200600984 | | 1/2006 |
| TW | 200903635 | A | 1/2009 |
| TW | 201124553 | A | 7/2011 |
| TW | 201214563 | A | 4/2012 |
| TW | 201405659 | A | 2/2014 |
| TW | 201426818 | A | 7/2014 |
| TW | 201510268 | A | 3/2015 |
| TW | 201629253 | A | 8/2016 |
| TW | 201704513 | A | 2/2017 |
| TW | 201706439 | A | 2/2017 |
| TW | 201732873 | A | 9/2017 |
| TW | 201823159 | A | 7/2018 |
| WO | WO 03/052162 | A1 | 6/2003 |
| WO | WO 2010/132579 | A2 | 11/2010 |
| WO | WO-2011011532 | A2 | 1/2011 |
| WO | WO 2011/109148 | A2 | 9/2011 |
| WO | WO-2017049253 | A1 | 3/2017 |
| WO | WO-2018063825 | A1 | 4/2018 |
| WO | WO-2018111570 | A1 | 6/2018 |

OTHER PUBLICATIONS

US Office Action dated Jan. 28, 2019 issued in U.S. Appl. No. 15/969,045.
US Final Office Action dated Aug. 6, 2019 issued in U.S. Appl. No. 15/969,045.
US Office Action dated Feb. 7, 2014 issued in U.S. Appl. No. 13/494,836.
US Final Office Action dated Aug. 21, 2014 issued in U.S. Appl. No. 13/494,836.
US Office Action dated May 5, 2015 issued in U.S. Appl. No. 13/494,836.
US Final Office Action dated Nov. 16, 2015 issued in U.S. Appl. No. 13/494,836.
US Office Action dated Mar. 10, 2016 issued in U.S. Appl. No. 13/494,836.
US Final Office Action dated Jul. 11, 2016 issued in U.S. Appl. No. 13/494,836.
US Office Action dated Jan. 9, 2017 issued in U.S. Appl. No. 13/494,836.
US Examiner's Answer to the Appeal brief [filed Apr. 28, 2017] before the Patent Trial and Appeal Board dated Sep. 25, 2017 issued in U.S. Appl. No. 13/494,836.
US Notice of Allowance dated Oct. 2, 2018 issued in U.S. Appl. No. 13/494,836.
U.S. Office Action dated Dec. 19, 2014 issued in U.S. Appl. No. 13/907,699.
U.S. Final Office Action dated May 14, 2015 issued in U.S. Appl. No. 13/907,699.
U.S. Advisory Action and Examiner Initiated Interview Summary dated Aug. 12, 2015 issued in U.S. Appl. No. 13/907,699.
U.S. Notice of Allowance dated Sep. 10, 2015 issued in U.S. Appl. No. 13/907,699.
U.S. Office Action dated Feb. 5, 2018 issued in U.S. Appl. No. 14/961,637.
U.S. Final Office Action dated Aug. 28, 2018 issued in U.S. Appl. No. 14/961,637.
U.S. Office Action dated Jan. 29, 2019 issued in U.S. Appl. No. 14/961,637.
U.S. Notice of Allowance dated Jun. 18, 2019 issued in U.S. Appl. No. 14/961,637.
U.S. Office Action dated Sep. 15, 2015 issued in U.S. Appl. No. 14/062,648.
U.S. Notice of Allowance dated Feb. 19, 2016 issued in U.S. Appl. No. 14/062,648.
U.S. Office Action dated Nov. 16, 2018 issued in U.S. Appl. No. 15/169,530.
U.S. Final Office Action dated Mar. 5, 2019 issued in U.S. Appl. No. 15/169,530.
U.S. Office Action dated Dec. 2, 2019 issued in U.S. Appl. No. 15/169,530.
U.S. Office Action dated Nov. 2, 2015 issued in U.S. Appl. No. 14/616,435.
U.S. Final Office Action dated Mar. 10, 2016 issued in U.S. Appl. No. 14/616,435.
U.S. Office Action dated Jul. 8, 2016 issued in U.S. Appl. No. 14/616,435.
U.S. Final Office Action dated Feb. 22, 2017 issued in U.S. Appl. No. 14/616,435.
U.S. Examiner's Answer to the Appeal brief [filed May 19, 2017] before the Patent Trial and Appeal Board dated Sep. 22, 2017 issued in U.S. Appl. No. 14/616,435.
U.S. Notice of Allowance dated Feb. 4, 2019 issued in U.S. Appl. No. 14/616,435.
U.S. Office Action dated Sep. 12, 2016 issued in U.S. Appl. No. 14/692,627.
US Final Office Action, dated May 19, 2017, issued in U.S. Appl. No. 14/692,627.
U.S. Office Action dated Nov. 8, 2017 issued in U.S. Appl. No. 14/692,627.
U.S. Final Office Action dated May 16, 2018 issued in U.S. Appl. No. 14/692,627.
U.S. Office Action dated Dec. 29, 2017 issued in U.S. Appl. No. 15/283,159.
U.S. Office Action dated Aug. 29, 2018 issued in U.S. Appl. No. 15/283,159.
U.S. Notice of Allowance dated Jan. 7, 2019 issued in U.S. Appl. No. 15/283,159.

(56) References Cited

OTHER PUBLICATIONS

U.S. Notice of Allowance dated Feb. 7, 2018 issued in U.S. Appl. No. 15/408,291.
U.S. Office Action dated Jul. 28, 2017 issued in U.S. Appl. No. 15/408,291.
U.S. Office Action dated Apr. 18, 2019 issued in U.S. Appl. No. 15/972,554.
U.S. Notice of Allowance dated Oct. 22, 2019 issued in U.S. Appl. No. 15/972,554.
U.S. Office Action dated Jul. 7, 2017 issued in U.S. Appl. No. 15/382,137.
U.S. Notice of Allowance dated Sep. 22, 2017 issued in U.S. Appl. No. 15/382,137.
Taiwan Office Action dated Dec. 22, 2015 issued in Application No. TW102120742.
Korean First Office Action dated Aug. 9, 2019 issued in Application No. KR 10-2013-0066728 [NOVLP466KR].
Taiwan Office Action dated Nov. 6, 2017 issued in Application No. TW 103119100.
Taiwan Notice of Allowance dated Jan. 8, 2019 issued in Application No. TW 107126975.
Singapore Notice of Allowance & Supplemental Exam Report dated Nov. 30, 2017 issued in Application No. SG 10201402381U.
Chinese First Office Action dated Sep. 5, 2016 issued in Application No. CN 201410576747.1.
Chinese First Office Action dated Dec. 20, 2018 issued in Application No. CN 201710307116.3.
Chinese Second Office Action dated Jun. 3, 2019 issued in Application No. CN 201710307116.3.
Taiwan Notice of Allowance and Search Report dated Jun. 14, 2018 issued in Application No. TW 103136697.
Taiwanese First Office Action dated Dec. 24, 2018 issued in Application No. TW 107123391.
Taiwanese Second Office Action dated Apr. 18, 2019 issued in Application No. TW 107123391.
Taiwanese Third Office Action dated Aug. 21, 2019 issued in Application No. TW 107123391.
Chinese First Office Action dated Jan. 3, 2018 issued in Application No. CN 201610084166.5.
Chinese Second Office Action dated Oct. 12, 2018 issued in Application No. CN 201610084166.5.
Chinese Third Office Action dated Apr. 22, 2019 issued in Application No. CN 201610084166.5.
Taiwanese First Office Action dated Jul. 31, 2019 issued in Application No. TW 105103396.
Chinese First Office Action dated Jun. 25, 2018 issued in Application No. CN 201610251266.2.
Chinese Second Office Action [Decision of Final Rejection] dated Jan. 25, 2019 issued in Application No. CN 201610251266.2.
PCT International Search Report and Written Opinion (ISA/KR) dated Mar. 15, 2018 issued in PCT/US2017/062882.
PCT International Preliminary Report on Patentability (ISA/KR) dated Jun. 6, 2019 issued in PCT/US2017/062882.
PCT International Search Report and Written Opinion (ISA/KR) dated Mar. 19, 2018 issued in PCT/US2017/064024.
PCT International Preliminary Report on Patentability (ISA/KR) dated Jun. 27, 2019 issued in PCT/US2017/064024.
PCT International Search Report and Written Opinion (ISA/KR) dated Dec. 26, 2017 issued in PCT/US2017/051794.
PCT International Preliminary Report on Patentability dated Apr. 11, 2019 (ISA/KR) issued in PCT/US2017/051794.
International Search Report and Written Opinion dated Nov. 8, 2019 (ISA/KR) issued in PCT/US2019/042821.
International Search Report and Written Opinion dated Nov. 20, 2019 (ISA/KR) issued in PCT/US2019/042812.
International Search Report and Written Opinion dated Oct. 25, 2019 issued in Application No. PCT/US2019/042413.

Benilan et al., (Oct. 4, 2011) "Optimization of microwave Hydrogen plasma discharges to mimic Lyman α(121.6 nm) solar irradiations," EPSC-DPS2011-1317, EPSC-DPJ Joint Meeting 2011, EPSC Abstracts, 6:2pp.
Blaszczyk-Lezak et al., (2005) "Silicon Carbonitride Films Produced by Remote Hydrogen Microwave Plasma CVD Using a (Dimethylamino)dimethylsilane Precursor," Chemical Vapor Deposition, 11(1):44-52.
Boo et al., (1999) "Growth of boron nitride thin films on silicon substrates using new organoboron precursors" Phys. Stat. sol. (a), vol. 176. Nov. 1999, pp. 705-710.
G.E. Coates et al., "Chapter Four: Organometallic compounds of elements of main groups IV and V," Principles of Organometallic Chemistry, (1968) pp. 121-122.
"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.
"Dummies' Guide To Hydrogen," Molecular Hydrogen Foundation, MHF, [downloaded at http://www.molecularhydrogenfoundation.org/core-information/dummies-guide-to-hydrogen on Sep. 23, 2015], 2 pp.
Fozza et al., (Jan./Feb. 1998) "Vacuum ultraviolet to visible emission of some pure gases and their mixtures used for plasma processing," J. Vac. Sci. Technol. A, American Vacuum Society, 16(1):72-77.
Fozza et al., (Jul. 2000) "Vacuum ultraviolet to visible emission from hydrogen plasma: Effect of excitation frequency," Journal of Applied Physics, 88(1):20-33.
Grubbs et al. (May/Jun. 2006) "Attenuation of hydrogen radicals traveling under flowing gas conditions through tubes of different materials," J. Vac. Sci. Technol. A, 24(3):486-496.
Hatanaka et al., (2000) "Experiments and analyses of SiC thin film deposition from organo-silicon by a remote plasma method," Thin Solid Films, 368:287-291.
Holländer et al., (May 1994) "Vacuum ultraviolet emission from microwave plasmas of hydrogen and its mixtures with helium and oxygen," J. Vac. Sci. Technol. A, 12(3):879-882.
Huran, J., et al., (2004) "RBS study of amorphous silicon carbide films deposited by PECVD," Czechoslovak Journal of Physics, 54(Suppl. C):C1006-C1010.
Jones et al., (Nov. 30, 2001) "Silicon Containing Polymers: The Science and Technology of Their Synthesis and Applications," Springer, p. 705.
"Radical (chemistry)" From Wikipedia, the free encyclopedia, [downloaded at http://en.wikipedia.org/wiki/Radical (chemistry) on Sep. 23, 2015), 11 pages.
Sota et al., (2010) "Influence of atomic bonds on electrical property of boron carbon nitride films synthesized by remote plasma-assisted chemical vapor deposition. Diamond & Related Materials" vol. 19, No. 12, Jun. 23, 2010, pp. 1441-1445.
Wróbel et al. (2001) "Oligomerization and Polymerization Steps in Remote Plasma Chemical Vapor Deposition of Silicon-Carbon and Silica Films from Organosilicon Sources," Chem. Mater, 13(5): 1884-1895.
Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," Appl. Organometal. Chem., 24:201-207.
Xu, Ying-Yu, et al., (1999) "Preparation of SiC Thin Film Using Organosilicon by Remote Plasma CVD Method," Mat. Res. Soc. Symp. Proc., 544:185-189.
U.S. Appl. No. 16/041,153, filed Jul. 20, 2018, Weimer et al.
U.S. Appl. No. 16/240,133, filed Jan. 4, 2019, Varadarajan.
U.S. Appl. No. 16/556,145, filed Aug. 29, 2019, Varadarajan.
US Office Action dated Jul. 9, 2019 issued in U.S. Appl. No. 16/041,153.
US Final Office Action dated Dec. 12, 2019 issued in U.S. Appl. No. 16/041,153.
US Office Action dated Mar. 6, 2020 issued in U.S. Appl. No. 15/696,045.
U.S. Final Office Action dated Apr. 10, 2020 issued in U.S. Appl. No. 15/169,530.

(56) References Cited

OTHER PUBLICATIONS

U.S. Office Action dated Mar. 19, 2020 issued in U.S. Appl. No. 16/194,102.
US Notice of Allowance dated Mar. 25, 2020 issued in U.S. Appl. No. 16/041,153.
Chinese Third Office Action dated Dec. 9, 2019 issued in Application No. CN 201710307116.3.
US Notice of Allowance dated Jul. 8, 2020 issued in U.S. Appl. No. 15/696,045.
U.S. Office Action dated Sep. 2, 2020 issued in U.S. Appl. No. 16/400,320.
U.S. Final Office Action dated Aug. 7, 2020 issued in U.S. Appl. No. 16/194,102.
U.S. Final Office Action dated Oct. 20, 2020 issued in U.S. Appl. No. 16/194,102.
U.S. Office Action dated Sep. 2, 2020 issued in U.S. Appl. No. 16/044,357.
US Notice of Allowance dated Jul. 24, 2020 issued in U.S. Appl. No. 16/041,153.
Korean Decision for Grant of Patent dated Dec. 27, 2019 issued in Application No. KR 10-2013-0066728.
Chinese First Office Action dated Nov. 19, 2020 issued in Application No. CN 201710812595.4.
Korean First Office Action dated May 9, 2020 issued in Application No. KR 2014-0066922.
Korean Decision for Grant dated Aug. 1, 2020 issued in Application No. KR 2014-0066922.
Chinese Reexamination Decision dated Apr. 8, 2020 issued in Application No. 201610251266.2.
U.S. Office Action dated Apr. 22, 2021 issued in U.S. Appl. No. 16/556,145.
U.S. Final Office Action dated Jun. 7, 2021 issued in U.S. Appl. No. 16/044,357.
Chinese Second Office Action dated May 6, 2021 issued in Application No. CN 201710812595.4.
Korean First Office Action dated Jun. 1, 2021 issued in Application No. KR 10-2014-0144392.
Chinese Fifth Office Action dated May 8, 2021 issued in Application No. CN 201610084166.5.
Taiwanese First Office Action dated May 13, 2021 issued in Application No. TW 106140423.
International Preliminary Report on Patentability dated Apr. 29, 2021 (ISA/KR) issued in Application No. PCT/US2019/055671.
U.S. Notice of Allowance dated Feb. 24, 2021 issued in U.S. Appl. No. 16/194,102.
U.S. Corrected Notice of Allowability dated Mar. 17, 2021 issued in U.S. Appl. No. 16/194,102.
Korean First Office Action dated Jan. 18, 2021 issued in Application No. KR 10-2020-0143459.
Korean Decision Grant of Patent dated Jul. 20, 2021 issued in Application No. KR 10-2020-0143459.
Chinese Fourth Office Action dated Mar. 1, 2021 issued in Application No. CN 201610084166.5.
Singapore Notice of Eligibility for Grant dated Jan. 11, 2021 issued in Application No. SG 10201600832V.
International Preliminary Report on Patentability dated Feb. 4, 2021 (ISA/KR) issued in PCT/US2019/042821.
International Preliminary Report on Patentability dated Feb. 4, 2021 (ISA/KR) issued in Application No. PCT/US2019/042812.
International Preliminary Report on Patentability dated Feb. 4, 2021 (ISA/KR) issued in Application No. PCT/US2019/042413.
International Search Report and Written Opinion dated Jan. 31, 2020 (ISA/KR) issued in Application No. PCT/US2019/055671.
U.S. Appl. No. 17/286,407, filed Apr. 16, 2021, Yuan et al..
U.S. Notice of Allowance dated Oct. 14, 2021 issued in U.S. Appl. No. 16/400,320.
U.S. Office Action dated Oct. 25, 2021 issued in U.S. Appl. No. 16/044,357.
Chinese Third Office Action dated Sep. 3, 2021 issued in Application No. CN 201710812595.4.
Korean Second Office Action dated Nov. 25, 2021 issued in Application No. KR 10-2014-0144392.
Korean First Office Action dated Nov. 25, 2021 issued in Application No. KR 10-2019-7012042.
Iwona Blaszczyk-Lezak et al., "Silicon Carbonitride Films Produced by Remote Hydrogen Microwave Plasma CVD Using a (Dimethylamino)dimethylsilane Precursor" Chem. Vap. Deposition (2005), 11, No. 11., pp. 1-9.
U.S. Appl. No. 17/644,051, filed Dec. 13, 2021, Varadarajan.
Advisory Action dated Aug. 11, 2021, in U.S. Appl. No. 16/044,357.
CN Office Action dated Sep. 3, 2021, in application No. CN201710812595.4 with English translation.
Co-pending U.S. Appl. No. 17/586,505, filed on Jan. 27, 2021.
Korean First Office Action dated Aug. 26, 2021 issued in Application No. KR 10-2017-0115040.
KR Office Action dated Dec. 7, 2021, in Application No. KR1020210140454 with English translation.
KR Office Action dated Feb. 11, 2022, in Application No. KR1020170115040 with English translation.
KR Office Action dated Jan. 6, 2022, in Application No. KR1020140144392 with English translation.
KR office action dated Nov. 25, 2021, in application No. KR20140144392.
KR office action dated Nov. 25, 2021, in application No. KR20197012042 with English translation.
Notice of Allowance dated Oct. 14, 2021 in U.S. Appl. No. 16/400,320.
U.S. Office Action dated Oct. 25, 2021, in U.S. Appl. No. 16/044,357.
U.S. Appl. No. 17/644,051, inventors Varadarajan et al., filed Dec. 13, 2021.
U.S. Corrected Notice of Allowance dated Jan. 27, 2022 in U.S. Appl. No. 16/400,320.
U.S. Final Office Action dated Nov. 30, 2021 issued in U.S. Appl. No. 16/556,145.
U.S. Appl. No. 17/704,572, inventors Varadarajan et al., filed Mar. 25, 2022.
U.S. Appl. No. 17/704,574, inventors Varadarajan et al., filed Mar. 25, 2022.
U.S. Appl. No. 17/704,582, inventors Varadarajan et al., filed Mar. 25, 2022.
U.S. Appl. No. 17/704,585, inventors Varadarajan et al., filed Mar. 25, 2022.
CN Office Action dated Apr. 17, 2023, in Application No. CN201980049405.5 with English translation.
CN Office Action dated Apr. 28, 2023, in Application No. CN201980084273.X with English translation.
CN Office Action dated Aug. 13, 2024 in CN Application No. 202110901818.0, with English Translation.
CN Office Action dated Dec. 2, 2022, in Application No. CN201710812595.4 with English translation.
CN Office Action dated Jan. 12, 2024 in CN Application No. 201780072499.9, with English Translation.
CN Office Action dated Jul. 20, 2022, in application No. CN201710812595.4 with English translation.
CN Office Action dated Jun. 17, 2024 in CN Application No. 202110823900.6, with English Translation.
CN Office Action dated Mar. 29, 2022, in application No. CN201710812595.4 with English translation.
CN Office Action dated May 6, 2024 in CN Application No. 202110901818 with English translation.
CN Office Action dated May 7, 2023, in Application No. CN201980058950 with English translation.
CN Office Action dated May 11, 2023, in Application No. CN201780060918.7 with English translation.
CN Office Action dated May 20, 2024 in CN Application No. 201980049654.4 with English translation.
CN Office Action dated May 31, 2023, in application No. CN20178072499 with English translation.
CN Office Action dated Nov. 1, 2022 in Application No. CN20198058950 With English translation.
CN Office Action dated Nov. 17, 2022, in Application No. CN201780072499.9 with English translation.

(56) References Cited

OTHER PUBLICATIONS

CN Office Action dated Nov. 24, 2022 in Application No. CN201980049405.5 with English translation.
CN Office Action dated Nov. 25, 2022 in Application No. CN201980084273.X with English translation.
CN Office Action dated Nov. 29, 2022 in Application No. CN201780060918.7 with English translation.
CN Office Action dated Oct. 18, 2024 in CN Application No. 201780072499.9 with English translation.
CN Office Action dated Sep. 1, 2023, in Application No. CN201780060918.7 with English translation.
CN Office Action dated Sep. 9, 2023, in Application No. CN201980084273.X with English translation.
CN Office Action dated Sep. 11, 2023, in application No. CN202110901818.0 with English translation.
CN Office Action dated Sep. 22, 2022, in Application No. CN201780086632.6 with English translation.
International Search Report and Written Opinion dated Mar. 15, 2018 in Application No. PCT/US2017/062882.
JP Office Action dated Oct. 31, 2023 in Application No. JP2021-521282 with English Translation.
Kikuchi, Y., et al., "Ultra Low-k Non-Porous SiOCH Film (k 2.2) Formed by Ultra Precise Molecular Control in Polymerization Synthesis by Using Large-Radius Neutral-Beam-Enhanced CVD," International Conference on Solid State Devices and Materials, 2013, pp. 856-857.
KR Office Action dated Jun. 23, 2022 in Application No. KR10-2019-7019853 with english translation.
KR Office Action dated Sep. 20, 2022, in Application No. KR10-2021-7005461 with English translation.
KR Notice of Allowance dated Nov. 26, 2024 in KR Application No. 10-2021-7005037, with English Translation.
KR Notice of Allowances dated Sep. 23, 2024 in KR Application No. 10-2023-7032359 with English Translation.
KR Office Action dated May 30, 2022, in Application No. KR10-2022-0042652 with English Translation.
KR Office Action dated Apr. 12, 2022, in Application No. KR1020197019853 with English translation.
KR Office Action dated Apr. 20, 2023, in application No. KR20227018731 with English translation.
KR Office Action dated Aug. 3, 2022 in Application No. KR10-2022-0017600 With English translation.
KR Office Action dated Aug. 4, 2022, in Application No. KR10-2022-0019130 With English translation.
KR Office Action dated Aug. 5, 2022 in Application No. KR10-2021-7015119 With English translation.
KR Office Action dated Aug. 5, 2022 in Application No. KR10-2022-7013124 with English translation.
KR Office Action dated Aug. 5, 2022 in Application No. KR10-2022-7013129 with English translation.
KR Office Action dated Aug. 7, 2024 in KR Application No. 10-2023-0016958 with English translation.
KR Office Action dated Aug. 14, 2024 in KR Application No. 10-2023-0066790, with English Translation.
KR Office Action dated Aug. 24, 2023, in application No. KR10-2019-7017914 with English translation.
KR Office Action dated Aug. 31, 2022 in Application No. KR10-2016-0014278 with English translation.
KR Office Action dated Dec. 5, 2022 in Application No. KR10-2022-7032867 With English Translation.
KR Office Action dated Feb. 1, 2024 in KR Application No. KR 10-2023-7041846 with English translation.
KR Office Action dated Feb. 8, 2023, in Application No. KR10-2016-0048396 with English translation.
KR Office Action dated Feb. 19, 2024 in KR Application No. 10-2023-7032359 with English translation.
KR Office Action dated Feb. 23, 2024 in KR Application No. 10-2021-7005037 with English Translation.
KR Office Action dated Feb. 27, 2023, in Application No. KR10-2019-7017914 with English translation.
KR Office Action dated Jan. 27, 2023, in Application No. KR10-2021-7005461 with English translation.
KR Office Action dated Jan. 27, 2023 in Application No. KR10-2022-0042654 with English translation.
KR Office Action dated Jul. 20, 2022, in Application No. KR10-2019-7017914 With English translation.
KR Office Action dated Jul. 20, 2022, in Application No. KR10-2022-7018307 with English translation.
KR Office Action dated Jul. 31, 2023, in application No. KR10-2016-0014278 with English translation.
KR Office Action dated Jun. 21, 2022, in Application No. KR10-2022-0029219 with English translation.
KR Office Action dated Jun. 21, 2022, in Application No. KR10-2022-0029223 with English translation.
KR Office Action dated Jun. 21, 2022, in Application No. KR10-2022-0029224 with English translation.
KR Office Action dated Jun. 26, 2022, in Application No. KR10-2022-7018307 with English translation.
KR Office Action dated Jun. 30, 2022 in Application No. KR10-2022-0042654 With English translation.
KR Office Action dated Mar. 7, 2023 in Application No. KR10-2021-7015119 with English translation.
KR Office Action dated Mar. 7, 2023 in Application No. KR10-2022-7013124 with English translation.
KR Office Action dated Mar. 7, 2023, in Application No. KR10-2022-7013129 with English translation.
KR Office Action dated Mar. 15, 2023, in Application No. KR10-2016-0014278 with English translation.
KR Office Action dated Mar. 18, 2024 in KR Application No. 10-2023-0072675, with English Translation.
KR Office Action dated May 3, 2022, in Application No. KR1020197012042 with English translation.
KR Office Action dated May 9, 2022 in KR Application No. KR10-2022-0017600 with English translation.
KR Office Action dated May 16, 2023 in Application No. KR10-2021-7005461 with English translation.
KR Office Action dated Nov. 18, 2022 in Application No. KR10-2021-7015119 with English Translation.
KR Office Action dated Nov. 18, 2022 in Application No. KR10-2022-7013124 with English translation.
KR Office Action dated Nov. 18, 2022 in Application No. KR10-2022-7013129 with English translation.
KR Office Action dated Oct. 12, 2022, in Application No. KR10-2022-0029219 with English translation.
KR Office Action dated Oct. 26, 2022, in Application No. KR10-2022-0029224 with English translation.
KR Office Action dated Oct. 28, 2022 in Application No. KR10-20217005460 with English translation.
KR Office Action dated Sep. 30, 2022, in Application No. KR10-2022-7018731 with English translation.
TW Office Action dated Aug. 4, 2023, in application No. TW108125646 with English translation.
TW Office Action dated Aug. 22, 2023, in application No. TW111102313 with English translation.
TW Office Action dated Dec. 29, 2022 in Application No. TW111102313 with English translation.
TW Office Action dated Jul. 7, 2023, in application No. TW108125937 with English translation.
TW Office Action dated Jul. 31, 2024 in TW Application No. 113116078, with English Translation.
TW Office Action dated Jun. 5, 2023, in Application No. TW108125985 with English translation.
TW Office Action dated May 7, 2024 in TW Application No. 108125646, with English Translation.
U.S. Non-Final office Action dated Jul. 12, 2022 in U.S. Appl. No. 17/586,505.
U.S. Non-Final office Action dated Oct. 5, 2022 in U.S. Appl. No. 17/704,585.
U.S. Non-Final office Action dated Sep. 7, 2022 in U.S. Appl. No. 17/286,407.
U.S Advisory Action dated Jan. 12, 2023, in U.S. Appl. No. 17/658,935.

(56) References Cited

OTHER PUBLICATIONS

U.S Advisory Action dated Jan. 23, 2023 in U.S. Appl. No. 17/658,937.
U.S Advisory Action dated Mar. 10, 2023 in U.S. Appl. No. 17/704,574.
U.S Advisory Action dated Mar. 17, 2023 in U.S. Appl. No. 17/586,505.
U.S. Corrected Notice of Allowance dated May 18, 2018 in U.S. Appl. No. 15/408,291.
U.S. Examiner's Answer to Appeal Brief Before the Patent Trial and Appeal Board on Dec. 27, 2022 in U.S. Appl. No. 16/044,357.
U.S. Final office Action dated Nov. 15, 2022 in U.S. Appl. No. 17/658,937.
U.S. Final office Action dated Oct. 25, 2022 in U.S. Appl. No. 17/586,505.
U.S. Final Office Action dated Apr. 15, 2022 in U.S. Appl. No. 16/044,357.
U.S. Final Office Action dated Dec. 23, 2022 in U.S. Appl. No. 17/704,574.
U.S. Final office Action dated Jan. 11, 2023 in U.S. Appl. No. 17/586,505.
U.S. Final office Action dated Jan. 12, 2023 in U.S. Appl. No. 17/286,407.
U.S. Final office Action dated Nov. 1, 2022 in U.S. Appl. No. 17/658,935.
U.S. Final Office Action dated Nov. 29, 2022 in U.S. Appl. No. 17/704,572.
U.S. Non Final Office Action dated Aug. 15, 2022 in U.S. Appl. No. 17/704,572.
U.S. Non-Final office Action dated Aug. 29, 2022 in U.S. Appl. No. 17/704,574.
U.S. Non-Final office Action dated Jul. 29, 2022 in U.S. Appl. No. 17/658,937.
U.S. Non-Final office Action dated Nov. 23, 2022 in U.S. Appl. No. 17/704,582.
U.S. Non-Final Office Action dated Aug. 16, 2024 in U.S. Appl. No. 18/539,977.
U.S. Non-Final office Action dated Jul. 22, 2022 in U.S. Appl. No. 17/658,935.
U.S. Non-Final Office Action dated Jun. 21, 2023, in U.S. Appl. No. 17/586,505.
U.S. Non-Final Office Action dated Sep. 10, 2024 in U.S. Appl. No. 18/501,395.
U.S. Notice of Allowance dated Apr. 5, 2023 in U.S. Appl. No. 17/704,574.
U.S. Notice of Allowance dated Aug. 4, 2023, in U.S. Appl. No. 17/286,407.
U.S. Notice of Allowance dated Aug. 16, 2023 in U.S. Appl. No. 17/286,407.
U.S. Notice of Allowance dated Dec. 29, 2023 in U.S. Appl. No. 17/586,505.
U.S. Notice of Allowance dated Feb. 10, 2023 in U.S. Appl. No. 17/704,585.
U.S. Notice of Allowance dated Feb. 13, 2023 in U.S. Appl. No. 17/704,572.
U.S. Notice of Allowance dated Jul. 24, 2023 in U.S. Appl. No. 17/704,574.
U.S. Notice of Allowance dated Mar. 13, 2023 in U.S. Appl. No. 17/704,582.
U.S. Notice of Allowance dated Nov. 15, 2023 in U.S. Appl. No. 17/286,407.
U.S. Notice of Allowance dated Nov. 29, 2024 in U.S. Appl. No. 18/539,977.
U.S. Notice of Allowance dated Oct. 2, 2023, in U.S. Appl. No. 17/586,505.
U.S. Restriction Requirement dated Jul. 7, 2022 in U.S. Appl. No. 17/704,585.
U.S. Restriction Requirement dated Apr. 15, 2022, in U.S. Appl. No. 17/586,505.
U.S. Restriction Requirement dated Aug. 26, 2022 in U.S. Appl. No. 17/704,582.

\* cited by examiner

REMOTE PLASMA BASED DEPOSITION OF SILICON CARBIDE FILMS USING SILICON-CONTAINING AND CARBON-CONTAINING PRECURSORS

CROSS-REFERENCE TO RELATED APPLICATIONS

This application is a continuation-in-part of U.S. patent application Ser. No. 14/616,435, filed Feb. 6, 2015, titled "CONFORMAL DEPOSITION OF SILICON CARBIDE FILMS,", which is a continuation-in-part of both U.S. patent application Ser. No. 13/494,836, filed Jun. 12, 2012, titled "REMOTE PLASMA BASED DEPOSITION OF SiOC CLASS OF FILMS," and U.S. patent application Ser. No. 13/907,699, filed May 31, 2013, titled "METHOD TO OBTAIN SiC CLASS OF FILMS OF DESIRED COMPOSITION AND FILM PROPERTIES,", each of which is incorporated herein by reference in its entirety and for all purposes.

BACKGROUND

The silicon carbide (SiC) class of thin films has unique physical, chemical, and mechanical properties and is used in a variety of applications, particularly integrated circuit applications. Classes of SiC thin films include oxygen doped silicon carbide, also known as silicon oxycarbide, nitrogen doped silicon carbide, also known as silicon nitricarbide, and oxygen and nitrogen doped silicon carbide, also known as silicon oxynitricarbide, and undoped silicon carbide.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of depositing a silicon carbide film on a substrate. The method includes providing a substrate in a reaction chamber, flowing a silicon-containing precursor into the reaction chamber towards the substrate, and flowing a co-reactant into the reaction chamber along with the silicon-containing precursor. The silicon-containing precursor has at least two hydrogen atoms bonded to a silicon atom, and the co-reactant is a hydrocarbon molecule. The method further includes generating, from a hydrogen source gas, radicals of hydrogen in a remote plasma source that are generated upstream of the silicon-containing precursor and the co-reactant, and introducing the radicals of hydrogen into the reaction chamber and towards the substrate, where the radicals of hydrogen are in a ground state to react with the silicon-containing precursor and the co-reactant to form a doped or undoped silicon carbide film on the substrate.

In some implementations, all or substantially all of the radicals of hydrogen in an environment adjacent to the substrate are radicals of hydrogen in the ground state. In some implementations, the hydrocarbon molecule has one or more carbon-to-carbon double bonds or triple bonds. The hydrocarbon molecule may include propylene, ethylene, butene, pentene, butadiene, pentadiene, hexadiene, heptadiene, toluene, benzene, acetylene, propyne, butyne, pentyne, or hexyne. In some implementations, the silicon-containing precursor includes a silane, disilane, trisilane, methylsilane, or dimethylsilane. In some implementations, the doped or undoped silicon carbide film has no C—C bonds or substantially no C—C bonds. In some implementations, the method further includes providing a nitriding agent along with the hydrogen source gas in the remote plasma source, where radicals of the nitriding agent are generated in the remote plasma source, and introducing the radicals of the nitriding agent along with the radicals of hydrogen into the reaction chamber and towards the substrate, where the radicals of the nitriding agent and hydrogen react with the silicon-containing precursor and the co-reactant to form a silicon carbonitride (SiCN) film. The SiCN film has no C—C bonds or substantially no C—C bonds, and no C—N bonds or substantially no C—N bonds. In some implementations, the method further includes providing an oxidizing agent along with the hydrogen source gas in the remote plasma source, where radicals of the oxidizing agent are generated in the remote plasma source, and introducing the radicals of the oxidizing agent along with the radicals of hydrogen into the reaction chamber and towards the substrate, wherein the radicals of the oxidizing agent and hydrogen react with the silicon-containing precursor and the co-reactant to form a silicon oxycarbide (SiCO) film. The SiCO film has no C—C bonds or substantially no C—C bonds, and no C—O bonds or substantially no C—O bonds. In some implementations, the doped or undoped silicon carbide film has a conformality of at least 75%. In some implementations, the silicon-containing precursor has (i) no C—O bonds, and (ii) no C—N bonds.

These and other aspects are described further below with reference to the drawings.

DETAILED DESCRIPTION

Figure 1A:
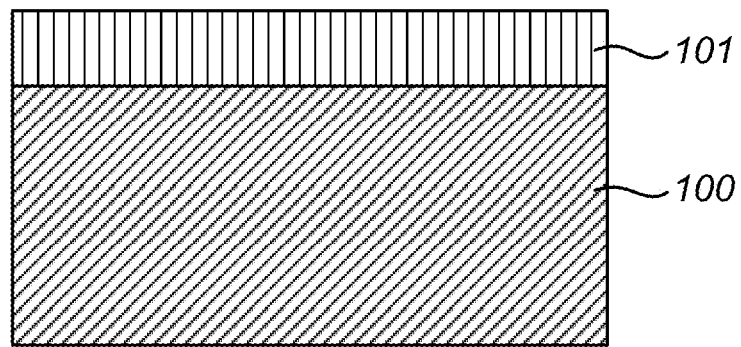
FIG. 1A illustrates a cross-sectional schematic of an example doped or undoped silicon carbide film deposited over a substrate.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Manufacture of semiconductor devices typically involves depositing one or more thin films on a substrate in an integrated fabrication process. In some aspects of the fabrication process, classes of thin films such as silicon carbide, silicon oxycarbide, silicon nitricarbide, and silicon oxynitricarbide are deposited using atomic layer deposition (ALD), chemical vapor deposition (CVD), plasma-enhanced chemical vapor deposition (PECVD), or any other suitable deposition method. As used herein, the term silicon carbide includes undoped or doped silicon carbides, such oxygen doped silicon carbide (SiCO), nitrogen doped silicon carbide (SiCN), and nitrogen and oxygen doped silicon carbide (SiOCN). For many, doped silicon carbides have at most about 50% atomic of dopant atoms, whether those atoms are oxygen, nitrogen, or atoms of another element. The doping level provides desired film properties.

Precursor molecules for depositing silicon carbides can include silicon-containing molecules having silicon-hydrogen (Si—H) and/or silicon-silicon (Si—Si) bonds, and silicon-carbon (Si—C) bonds. Precursor molecules for depositing silicon oxycarbides include silicon-containing molecules having silicon-hydrogen (Si—H) bonds and/or silicon-silicon (Si—Si) bonds, and silicon-oxygen (Si—O) bonds and/or silicon-carbon (Si—C) bonds. Precursor molecules for depositing silicon nitricarbides include silicon-containing molecules having silicon-hydrogen (Si—H) bonds and/or silicon-silicon (Si—Si) bonds, and silicon-nitrogen (Si—N) bonds and/or silicon-carbon (Si—C) bonds. Precursor molecules for depositing silicon oxynitricarbides include silicon-containing molecules having silicon-hydrogen (Si—H) bonds and/or silicon-silicon (Si—Si) bonds, and silicon-nitrogen (Si—N) bonds, silicon-oxygen (Si—O) bonds, and/or silicon-carbon (Si—C) bonds. Current PECVD processes may use in situ plasma processing in which a plasma is provided directly adjacent to a substrate.

It has been found that depositing high-quality silicon carbide thin films can have certain challenges, such as providing films with excellent step coverage, low dielectric constants, high breakdown voltages, low leakage currents, high porosity, and/or coverage over exposed metal surfaces without oxidizing the metal surfaces.

While this disclosure is not limited by any particular theory, it is believed that the plasma conditions in typical PECVD processes fragment the silicon-containing precursor molecules in a manner that produces undesirable effects. For example, PECVD may break Si—O and/or Si—C bonds in the precursor molecules to produce highly reactive radicals or other fragment types having high sticking coefficients. The fragments of the resulting doped silicon carbide film can include silicon, carbon, and/or oxygen atoms with bonds that are "dangling," meaning that silicon, carbon, and/or oxygen atoms have reactive unpaired valence electrons. High sticking coefficients of the precursor molecules and their fragments can deposit silicon carbide films with poor step coverage, as reactive precursor fragments may disproportionately stick to the upper regions of sidewalls and other structures in recessed features.

The dangling bonds can produce silanol groups (Si—OH) in a deposited silicon oxycarbide or silicon oxynitricarbide film. The dangling bonds can also produce silyl amine groups (Si—$NH_2$) in a deposited silicon carbonitride film. As a result of these functional groups, the film may have detrimentally high dielectric constants. Film quality may also suffer because the direct plasma conditions tend to extract carbon out of the deposited film.

Furthermore, the dangling bonds can produce increased silicon-hydrogen bonding (Si—H) in deposited silicon carbide films. Broken bonds of Si—C can be replaced with Si—H in direct plasma deposition conditions. The presence of Si—H bonds in silicon carbide films can produce films with poor electrical properties. For example, the presence of Si—H bonds can reduce breakdown voltages and can increase leakage currents because the Si—H bonds provide a leakage path for electrons.

Further, the dangling bonds can lead to uncontrolled chemical or morphological structures in the silicon carbide films. In some cases, such structures are dense filaments having low or no porosity, such that the film has an unacceptably high dielectric constant. The lack of porosity can be the result of the direct plasma conditions breaking Si—C and/or Si—O bonds in cyclic siloxanes that would otherwise provide porosity in an ultralow-k dielectric material.

Direct plasma conditions sometimes employed in PECVD can lead to directionality in the deposition because the energy to break up the precursor molecules can be a low frequency which creates a lot of ion bombardment at the surface. The directional deposition can also lead to deposition of silicon carbide films with poor step coverage. A direct plasma is a plasma in which the plasma (electrons and positive ions at an appropriate concentration) reside in close proximity to the substrate surface during deposition, sometimes separated from the substrate surface by only a plasma sheath.

Typical PECVD processes are sometimes inappropriate for depositing silicon carbide films over exposed copper or other metal surfaces because such processes can oxidize metal. The PECVD process may use oxidants such as oxygen ($O_2$), ozone ($O_3$), carbon dioxide ($CO_2$), or other oxidizing species to form a silicon oxycarbide film.

Environment at the Substrate Surface During Deposition

FIG. 1A illustrates a cross-section of an example silicon carbide film deposited over a substrate. The silicon carbide film 101 can be formed under process conditions producing a relatively mild environment adjacent to the substrate 100. The substrate 100 can be any wafer, semiconductor wafer, partially fabricated integrated circuit, printed circuit board, display screen, or other appropriate work piece. The process for depositing the silicon carbide film 101 can involve one or more silicon-containing precursors having one or more Si—H bonds and/or one or more Si—Si bonds. Optionally, the one or more silicon-containing precursors may include other bonds such as Si—C bonds, Si—O bonds, and/or Si—N bonds, depending on the type of doped structure to be produced.

Certain applications employing silicon carbide films are depicted in FIGS. 1B-1E. In some embodiments, the silicon-containing precursors can include silicon-oxygen containing precursors, silicon-nitrogen containing precursors, and/or silicon-carbon containing precursors. The silicon-oxygen containing precursors can include one or more Si—O bonds, the silicon-nitrogen containing precursors can include one or more Si—N bonds, and the silicon-carbon containing precursors can include one or more Si—C bonds. In some embodiments, for example, the silicon-containing precursors can include a single reactant A with Si—O and Si—C bonds, or Si—N and Si—C bonds. In some embodiments, the silicon-containing precursors can include a reactant B with Si—O bonds or Si—N bonds, and a reactant C with Si—C bonds. It will be understood that any number of suitable reactants may be employed in the scope of this present disclosure. The chemical structures of example silicon-containing precursors are discussed in further detail below.

The silicon-containing precursor includes one or more Si—H bonds and/or one or more Si—Si bonds. However, it will be understood that additional silicon-containing precursors may not necessarily include Si—H or Si—Si bonds. These additional silicon-containing precursors may be provided concurrently with the silicon-containing precursor having one or more Si—H and/or Si—Si bonds. During the deposition process, the Si—H bonds and/or Si—Si bonds are broken and serve as reactive sites for forming bonds between the silicon-containing precursors or other precursors in the deposited silicon carbide film 101. The broken bonds can also serve as sites for cross-linking during thermal processing conducted during or after deposition. Bonding at the reactive sites and cross-linking can form a primary backbone or matrix collectively in the resulting silicon carbide film 101.

In some embodiments, the process conditions can preserve or substantially preserve Si—C bonds and, if present, Si—O and Si—N bonds in the as-deposited layer of the silicon carbide film 101. Accordingly, the reaction conditions adjacent to the substrate 100 provide for the selective breaking of Si—H and/or Si—Si bonds, e.g., extracting hydrogen from the broken Si—H bonds, but the reaction conditions do not provide for extracting oxygen from Si—O bonds, nitrogen from Si—N bonds, or carbon from Si—C bonds. However, introduction of a co-reactant such as oxygen may extract carbon from Si—C bonds. It will be understood that other reaction mechanisms may be taking place at the environment adjacent to the substrate surface, including reaction mechanisms that are less kinetically favorable such as substitution reactions. Generally, the described reaction conditions exist at the exposed face of the substrate 100 (the face where the silicon carbide film 101 is deposited). They may further exist at some distance above the substrate 100, e.g., about 0.5 micrometers to about 150 millimeters above the substrate 100. In effect, activation of the precursor can happen in the gas phase at a substantial distance above the substrate 100. Typically, the pertinent reaction conditions will be uniform or substantially uniform over the entire exposed face of the substrate 100, although certain applications may permit some variation.

In addition to silicon-containing precursors, the environment adjacent the work piece (e.g., substrate 100) can include one or more radical species, preferably in a substantially low energy state. An example of such species includes hydrogen radicals (i.e., hydrogen atom radicals). In some embodiments, all, or substantially all, or a substantial fraction of the hydrogen atom radicals can be in the ground state, e.g., at least about 90% or 95% of the hydrogen atom radicals adjacent the work piece are in the ground state. In certain embodiments, source gas is provided in a carrier gas such as helium. As an example, hydrogen gas may be provided in a helium carrier at a concentration of about 1-10% hydrogen. Pressure, fraction of carrier gas such as helium, and other process conditions are chosen so that the hydrogen atoms encounter the substrate 100 as radicals in a low energy state without recombining.

As explained elsewhere, hydrogen gas may be supplied into a remote plasma source to generate hydrogen atom radicals. The remote plasma source may be positioned upstream from the substrate surface and the environment adjacent to the substrate surface. Once generated, the hydrogen atom radicals may be in an excited energy state. For example, hydrogen in an excited energy state can have an energy of at least 10.2 eV (first excited state). Excited hydrogen atom radicals may cause unselective decomposition of a silicon-containing precursor. For example, hydrogen atom radicals in an excited state can easily break Si—H, Si—Si, Si—N, Si—O, and Si—C bonds, which can alter the composition or physical or electrical characteristics of the silicon carbide film 101. In some implementations, when the excited hydrogen atom radicals lose their energy, or relax, the excited hydrogen atom radical may become a substantially low energy state hydrogen atom radical or a ground state hydrogen atom radical. Hydrogen atom radicals in a substantially low energy state or ground state can be capable of selectively breaking Si—H and Si—Si bonds while generally preserving Si—O, Si—N, and Si—C bonds. In some implementations, process conditions may be provided so that excited hydrogen atom radicals lose energy or relax to form substantially low energy state or ground state hydrogen atom radicals. For example, the remote plasma source or associated components may be designed so that a residence time of hydrogen atom radicals diffusing from the remote plasma source to the substrate 100 is greater than the energetic relaxation time of an excited hydrogen atom radical. The energetic relaxation time for an excited hydrogen atom radical can be about equal to or less than about $1 \times 10^{-3}$ seconds.

A state in which a substantial fraction of hydrogen atom radicals are in the ground state can be achieved by various techniques. Some apparatuses, such as described below, are designed to achieve this state. Apparatus features and process control features can be tested and tuned to produce a mild state in which a substantial fraction of the hydrogen atom radicals are in the ground state. For example, an apparatus may be operated and tested for charged particles downstream of the plasma source; i.e., near the substrate 100. The process and apparatus may be tuned until substantially no charged species exist near the substrate 100. Additionally, apparatus and process features may be tuned to a configuration where they begin to produce a silicon carbide film 101 from a standard silicon-containing precursor. The relatively mild conditions that support such film deposition are chosen.

Other examples of radical species include oxygen-containing species such as elemental oxygen radicals (atomic or diatomic), nitrogen-containing species such as elemental nitrogen radicals (atomic or diatomic), and N—H containing radicals such as ammonia radicals, where nitrogen is optionally incorporated into the film. Examples of N—H containing radicals include but are not limited to radicals of methylamine, dimethylamine, and aniline. The aforementioned radical species may be produced from a source gas that includes hydrogen, nitrogen, N—H containing species, or mixtures thereof. In some embodiments, substantially all or a substantial fraction of atoms of the deposited film are provided by the precursor molecules. In such cases, the low energy radicals used to drive the deposition reaction may be exclusively hydrogen or other species that does not substantially contribute to the mass of the deposited layer. In some embodiments, as discussed in further detail below, the radical species can be produced by a remote plasma source. In some embodiments, some radicals of higher energy state or even ions can potentially be present near the wafer plane.

In some embodiments, the process conditions employ radical species in a substantially low energy state sufficient to break Si—H bonds and/or Si—Si bonds while substantially preserving Si—O, Si—N, and Si—C bonds. Such process conditions may not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to break Si—O, Si—N, and Si—C bonds, which can produce films with undesirable electrical properties (e.g., high dielectric constants and/or low breakdown voltages) and poor conformality. It is believed that an excessively reactive environment produces reactive precursor fragments that have high sticking coefficients (representing a propensity to chemically or physically stick to work piece sidewalls), resulting in poor conformality.

The silicon-containing precursors are typically delivered with other species, notably carrier gas, in the environment adjacent to the substrate 100. In some implementations, the silicon-containing precursors are present with the radical species and other species, including other reactive species and/or carrier gases. In some embodiments, the silicon-containing precursors may be introduced as a mixture. Upstream from the deposition reaction surface, the silicon-containing precursors can be mixed with an inert carrier gas. Example inert carrier gases include, but are not limited to, argon (Ar) and helium (He). In addition, the silicon-containing precursors can be introduced in a mixture having major and minor species, with the minor species containing some element or structural feature (e.g., a ring structure, a cage structure, an unsaturated bond, etc.) that is present in the silicon carbide film 101 at a relatively low concentration. It will be understood, however, that the minor species may not significantly contribute to the composition or structural feature of the silicon carbide film 101. The multiple precursors may be present in equimolar or relatively similar proportions as appropriate to form the primary backbone or matrix in the resulting silicon carbide film 101. In other embodiments, the relative amounts of the different precursors are substantially skewed from equimolarity.

In some embodiments, one or more silicon-containing precursors provide essentially all of the mass of the deposited silicon carbide film 101, with small amounts of hydrogen or other element from a remote plasma providing less than about 5% atomic or less than about 2% atomic of the film mass. In some embodiments, only the radical species and the one or more silicon-containing precursors contribute to the composition of the deposited silicon carbide film 101. In other embodiments, the deposition reaction includes a co-reactant other than one or more silicon-containing precursors and the radical species, which may or may not contribute to the composition of the deposited silicon carbide film 101. Examples of such co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), and combinations thereof. Such materials may be used as nitriding agents, oxidizers, reductants, etc. In some cases, they can be used to tune the amount of carbon in the deposited film by removing or adding a fraction of the carbon provided with the silicon-containing precursor. In some implementations employing a non-hydrogen co-reactant, the co-reactant is introduced to the reaction chamber via the same flow path as the silicon-containing precursor; e.g., a path including a gas outlet or showerhead, typically without direct exposure to plasma. In some embodiments, oxygen and/or carbon dioxide is introduced with the precursor to alter the composition of the silicon carbide film 101 by removing carbon from the film or precursor during deposition. In some implementations employing a non-hydrogen co-reactant, the co-reactant is introduced to the reaction chamber via the same flow path as the hydrogen, such that the co-reactant is at least partially converted to radicals and/or ions. In such implementations, the hydrogen radicals and the co-reactant radicals both react with the silicon-containing precursor(s) to produce the deposited silicon carbide film 101.

In certain embodiments where co-reactants are used and they are introduced to the chamber with the species being converted to radicals (e.g., hydrogen), they may be provided to the reaction chamber in relatively small amounts in comparison to the other gases in the reaction chamber, including the source of radicals (e.g., hydrogen) and any carrier gas(es) such as helium. For example, the co-reactant may be present in the process gases at about 0.05% or less by mass, or at about 0.01% or less by mass, or at about 0.001% or less by mass. For example, a reactant mixture (that goes into the plasma source) may be about 10-20 liters per minute (L/m) He, about 200-500 standard cubic centimeters per minute (sccm) H2, and about 1-10 sccm oxygen. However, it will be understood that in some implementations, the co-reactant may be present in the process gases at about 0.05% or more by mass, or at about 1% or more by mass, or at about 20% or more by mass. When the co-reactants are introduced to the reaction chamber along with the silicon-containing precursor (e.g., through a gas outlet or showerhead), they may be present at a higher concentration; for example about 2% or less or about 0.1% or less by mass. When the co-reactant is a relatively weak reactant (e.g., a weak oxidant such as carbon dioxide), it may be present at even higher concentrations, such as about 10% or less or about 4% or less by mass. When the co-reactant is an additive or additional precursor, it may be present at even higher concentrations, such as about 10% or more or 20% or more by mass.

The temperature in the environment adjacent to the substrate 100 can be any suitable temperature facilitating the deposition reaction, but sometimes limited by the application of the device containing the silicon carbide film 101. In some embodiments, the temperature in the environment adjacent to the substrate 100 can be largely controlled by the temperature of a pedestal on which a substrate 100 is supported during deposition of the silicon carbide film 101. In some embodiments, the operating temperature can be between about 50° C. and about 500° C. For example, the operating temperature can be between about 250° C. and about 400° C. in many integrated circuit applications. In some embodiments, increasing the temperature can lead to increased cross-linking on the substrate surface.

The pressure in the environment adjacent to the substrate 100 can be any suitable pressure to produce reactive radicals in a reaction chamber. In some embodiments, the pressure can be about 35 Torr or lower. For example, the pressure can be between about 10 Torr and about 20 Torr, such as in embodiments implementing a microwave generated plasma. In other examples, the pressure can be less than about 5 Torr, or between about 0.2 Torr and about 5 Torr, such as in embodiments implementing a radio-frequency (RF) generated plasma.

The environment adjacent to the substrate 100 provides for deposition of the silicon carbide film 101 on the substrate 100 by remote plasma CVD. A source gas is supplied to a remote plasma source, and power is provided to the remote plasma source that may cause the source gas to dissociate and generate ions and radicals in an excited energy state. After excitation, the radicals in the excited energy state relax to substantially low energy state radicals or ground state radicals, such as ground state hydrogen radicals. Bonds in the silicon-containing precursor may be selectively broken by the hydrogen radicals in a relaxed energy state. Bonds in the co-reactant or additional precursor may be selectively broken by the hydrogen radicals in a relaxed energy state to activate the co-reactant or additional precursor.

Figure 1B:
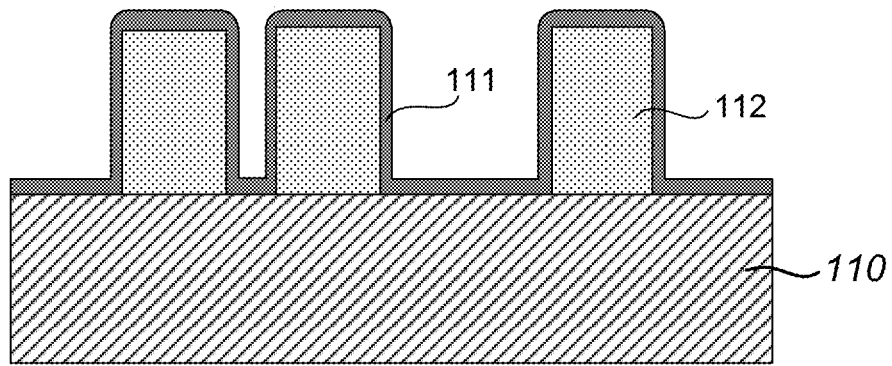
FIG. 1B illustrates a cross-sectional schematic of an example doped or undoped silicon carbide film conformally deposited on features of a substrate.
Figure 1C:
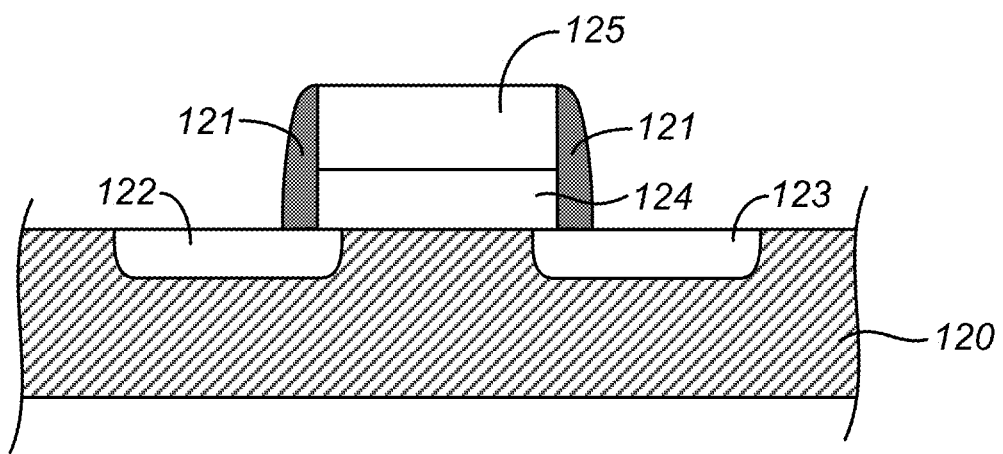
FIG. 1C illustrates a cross-sectional schematic of example doped or undoped silicon carbide vertical structures on sidewalls of a gate electrode of a transistor.
Figure 1D:
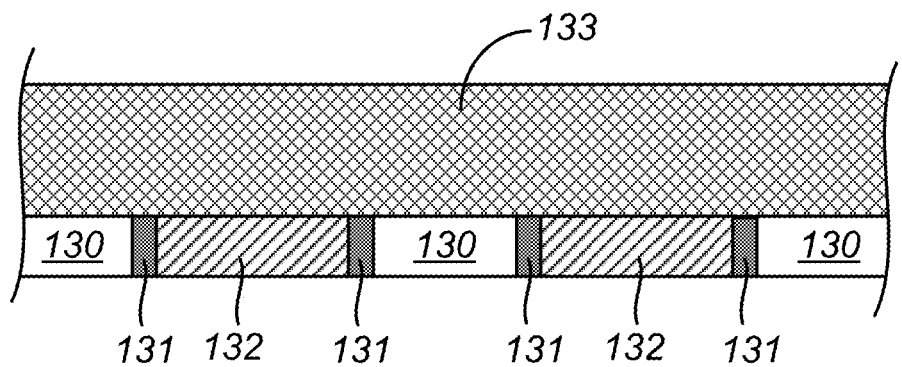
FIG. 1D illustrates a cross-sectional schematic of example doped or undoped silicon carbide vertical structures on exposed sidewalls of copper lines in an air gap type metallization layer.
Figure 1E:
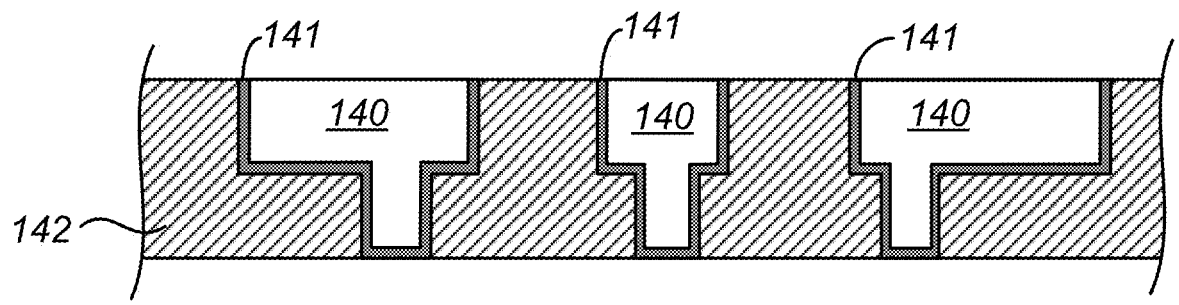
FIG. 1E illustrates a cross-sectional schematic of example doped or undoped silicon carbide pore sealants for porous dielectric materials.

Silicon carbide films are frequently used in semiconductor devices. For example, doped or undoped silicon carbide films may be employed as metal diffusion barriers, etch stop layers, hard mask layers, gate spacers for source and drain implants, encapsulation barriers for magnetoresistive random-access memory (MRAM) or resistive random-access memory (RRAM), and hermetic diffusion barriers at air gaps, among other applications. FIGS. 1B-1E illustrate cross-sections of structures containing silicon carbide films in a variety of applications. FIG. 1B illustrates silicon carbide thin film conformally deposited on features of a substrate. FIG. 1C illustrates silicon carbide vertical structures on the sidewalls of a gate electrode structure of a transistor. FIG. 1D illustrates silicon carbide vertical structures on exposed sidewalls of copper lines in an air gap type metallization layer. FIG. 1E illustrates silicon carbide pore sealants for porous dielectric materials. Each of these applications is discussed in further detail below.

Chemical Structure of Precursors

As discussed, the precursors employed in forming silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. However, in some implementations, the silicon-containing precursor has two or more hydrogen atoms bonded on a silicon atom or on every silicon atom. In addition, the silicon-containing precursors may include at least one Si—O bond, at least one Si—N bond, and/or at least one Si—C bond. While any number of appropriate precursors can be used in forming silicon carbide films, at least some of the precursors will include silicon-containing precursors with at least one Si—H bond or Si—Si bond, and optionally at least one Si—O bond, Si—N bond, and/or Si—C bond. In various implementations, the silicon-containing precursor(s) contain no O—C or N—C bonds; e.g., the precursor(s) contain no alkoxy (—O—R), where R is an organic group such as a hydrocarbon group, or amine (—NR$_1$R$_2$) groups, wherein R$_1$ and R$_2$ are independently hydrogen or organic groups. It is believed that such groups may impart high sticking coefficients to the precursors or fragments on which they reside.

In certain embodiments, some of the carbon provided for in the silicon carbide film may be provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups; higher numbers of carbon atoms may be used such as 2, 3, 4, 5, or 6 carbon atoms. In certain embodiments, the hydrocarbon group is linear. In certain embodiments, the hydrocarbon group is cyclic.

In certain embodiments, some of the carbon provided for in the silicon carbide film may be provided by one or more hydrocarbon molecules in a carbon-containing precursor. Such hydrocarbon molecules may include carbon-to-carbon chains, where a number of carbon atoms may be used such as 2, 3, 4, 5, 6, or 7 carbon atoms. In some implementations, the hydrocarbon molecules include one or more carbon double bonds and/or carbon triple bonds.

In some embodiments, the silicon-containing precursor falls into a chemical class. It will be understood that other chemical classes of silicon-containing precursors may be employed and that the silicon-containing precursors are not limited to the chemical classes discussed below.

In some embodiments, the silicon-containing precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into a silicon carbide film, with the size of the pores corresponding to the radius of the ring. For example, a cyclotetrasiloxane ring can have a radius of about 6.7 Å.

Figure 2:
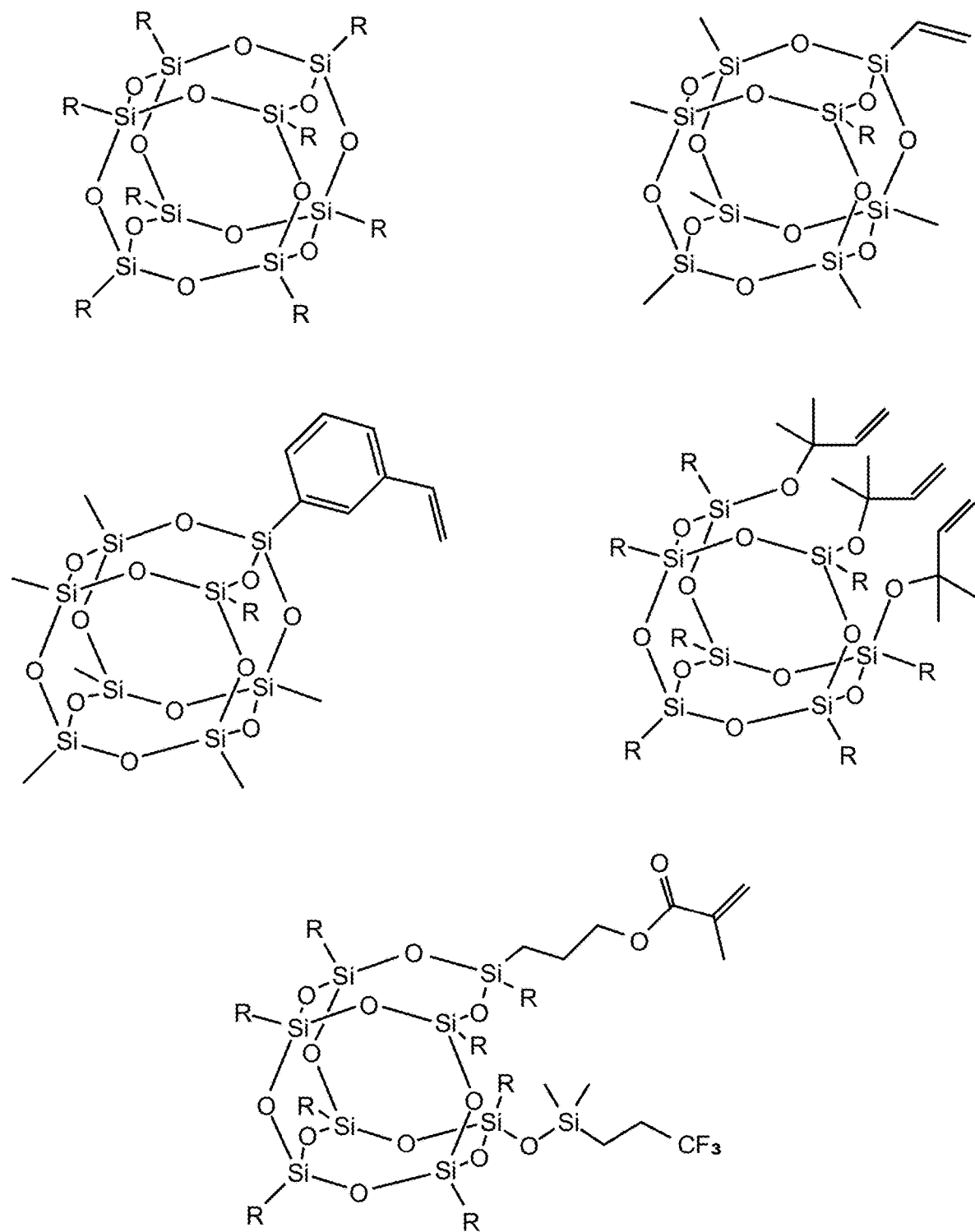
FIG. 2 illustrates chemical structures of examples of representative caged siloxane precursors.

In some embodiments, the siloxane may have a three-dimensional or caged structure. FIG. 2 illustrates examples of representative caged siloxane precursors. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety and for all purposes. Like the cyclic siloxanes, the caged siloxane can introduce porosity into a silicon carbide film. In some embodiments, the porosity scale is mesoporous.

In some embodiments, the siloxane may be linear. Examples of suitable linear siloxanes include but are not limited to disiloxanes, such as pentamethyldisiloxane (PMDSO) and tetramethyldisiloxane (TMDSO), and trisiloxanes such as hexamethyltrisiloxane, heptamethyltrisiloxane.

In some embodiments, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane (($CH_3$)$_2$Si—$CH_2$—Si($CH_3$)$_3$), and dimethylsilane (2MS).

In some embodiments, the silicon-containing precursor can be an alkoxy silane. However, in some embodiments, it may be understood that the silicon-containing precursor is not an alkoxy silane to avoid the presence of alkoxy groups. Alkoxy silanes include a central silicon atom with one or more alkoxy groups bonded it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). In some embodiments, one of the silicon atoms can have a carbon-containing or hydrocarbon-containing group attached to it, and one of the silicon atoms can have a hydrogen atom attached to it.

In some embodiments, the silicon-containing precursor can be a nitrogen-containing compound such as a silicon-nitrogen hydride (e.g., a silazane). Generally, such compounds contain carbon, but only bonded to silicon atoms, and not to nitrogen atoms. In certain embodiments, the nitrogen-containing compound does not have any carbon-nitrogen bonds. In certain embodiments, the nitrogen-containing compound does not have any amine moieties (—C—$NR_1R_2$), where $R_1$ and $R_2$ are the same or different groups such hydrogen atoms and hydrocarbon groups such as alkyl groups, alkene groups, or alkyne groups. Examples of suitable silicon-nitrogen precursors include various silazanes such as cyclic and linear silazanes containing one or more hydrocarbon moieties bonded to one or more silicon atoms and one or more hydrogen atoms bonded to one or more silicon atoms. Examples of silazanes include methyl-substituted disilazanes and trisilazanes, such as tetramethyldisilazane and hexamethyl trisilazane.

In depositing silicon carbide, multiple silicon-containing precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting silicon carbide film. For example, the amount of siloxane can be greater than the amount of silane in molar percentages to produce a porous film as discussed in more detail below.

For depositing oxygen doped silicon carbide films, examples of suitable precursors can include cyclic siloxanes such as cyclotetrasiloxanes such as heptamethylcyclotetrasiloxane (HMCTS) and tetramethylcyclotetrasiloxane. Other cyclic siloxanes can also include but are not limited to cyclotrisiloxanes and cyclopentasiloxanes. For depositing oxygen doped silicon carbide films, other examples of suitable precursors include linear siloxanes such as, but not limited to, disiloxanes, such as pentamethyldisiloxane (PMDSO), tetramethyldisiloxane (TMDSO), hexamethyl trisiloxane, and heptamethyl trisiloxane.

For depositing undoped silicon carbide films, examples of suitable precursors can include monosilanes substituted with one or more alkyl, alkene, and/or alkyne groups containing, e.g., 1-5 carbon atoms. Examples include but are not limited to trimethylsilane (3MS), dimethylsilane (2MS), triethylsilane (TES), and pentamethyldisilamethane. Additionally, disilanes, trisilanes, or other higher silanes may be used in place of monosilanes. Examples of disilanes can include hexamethyldisilane (HMDS) and pentamethyldisilane (PMDS). Other types of alkyl silanes can include alkylcarbosilanes. Examples include dimethyl trimethylsilyl methane (DTMSM) and bis-dimethylsilyl ethane (BDMSE).

For depositing nitrogen doped silicon carbide films, examples of suitable precursors can include silazanes, e.g., alkyldisilazanes and possibly compounds including amino (—NH2) and alkyl groups separately bonded to one or more silicon atoms. Alkyldisilazanes include silizanes and alkyl groups bonded to two silicon atoms. An example includes 1,1,3,3-tetramethyldisilazane (TMDSN).

As explained, silicon-containing precursors are chosen to provide highly conformal silicon carbide films. It is believed that silicon-containing precursors having low sticking coefficients are capable of producing highly conformal films. "Sticking coefficient" is a term used to describe the ratio of the number of adsorbate species (e.g., fragments or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. In some cases, the sticking coefficient of the precursors (at the relevant deposition conditions) may be about 0.05 or less, for example about 0.001 or less.

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma. An example of a suitable remote plasma apparatus is described in U.S. patent application Ser. No. 14/062,648, filed Oct. 24, 2013, which is incorporated herein by reference in its entirety and for all purposes.

Figure 3:
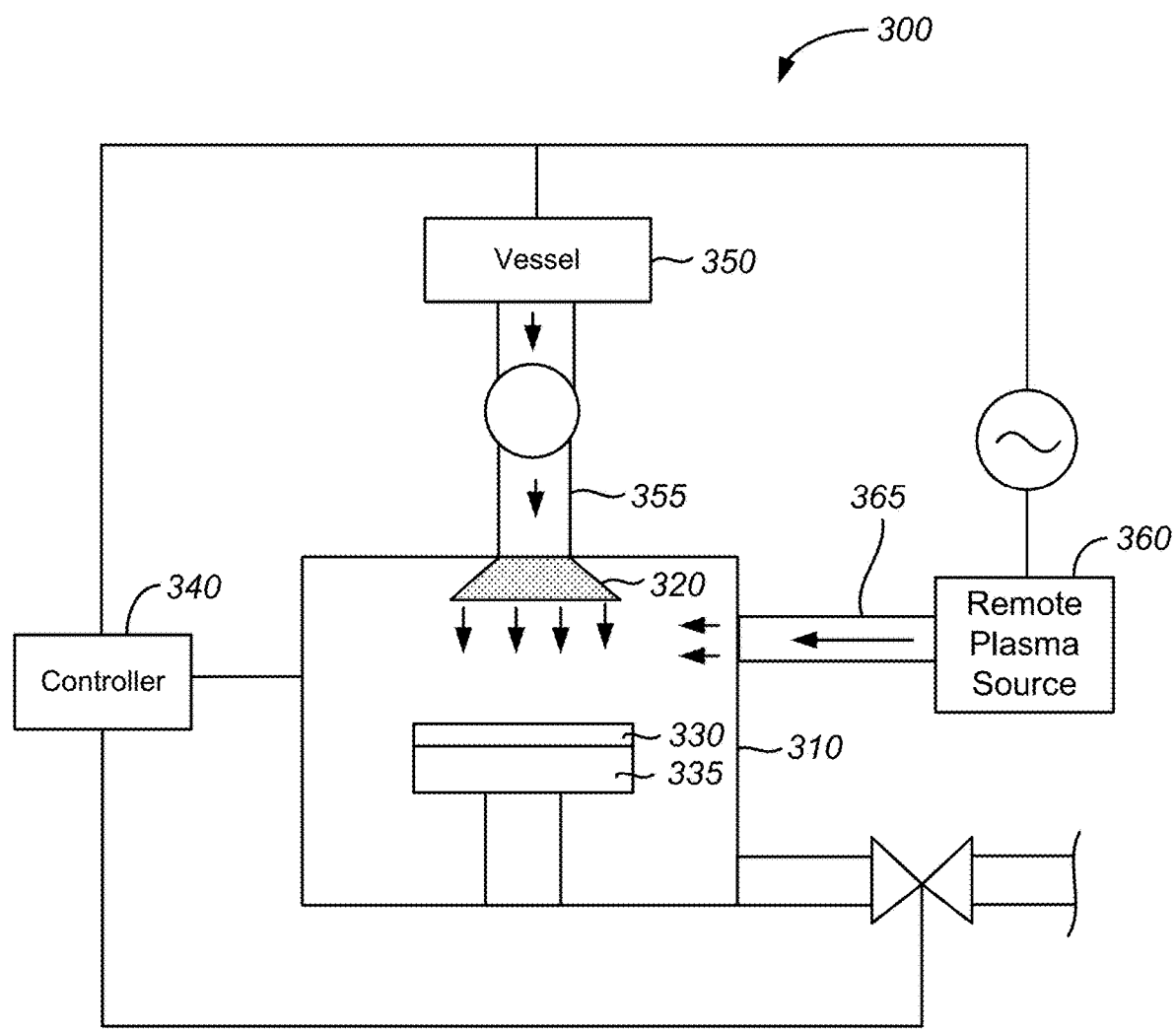
FIG. 3 illustrates a schematic diagram of an example plasma processing apparatus with a remote plasma source according to some implementations.

FIG. 3 presents a schematic diagram of a remote plasma apparatus according to certain embodiments. The device 300 includes a reaction chamber 310 with a showerhead 320. Inside the reaction chamber 310, a substrate 330 rests on a stage or pedestal 335. In some embodiments, the pedestal 335 can be fitted with a heating/cooling element. A controller 340 may be connected to the components of the device 300 to control the operation of the device 300. For example, the controller 340 may contain instructions for controlling process conditions for the operations of the device 300, such as the temperature process conditions and/or the pressure process conditions. In some embodiments, the controller 340 may contain instructions for controlling the flow rates of precursor gas, co-reactant gas, source gas, and carrier gas. The controller 340 may contain instructions for changing the flow rate of the co-reactant gas over time. In addition or in the alternative, the controller 340 may contain instructions for changing the flow rate of the precursor gas over time. A more detailed description of the controller 340 is provided below.

During operation, gases or gas mixtures are introduced into the reaction chamber 310 via one or more gas inlets coupled to the reaction chamber 310. In some embodiments, two or more gas inlets are coupled to the reaction chamber 310. A first gas inlet 355 can be coupled to the reaction chamber 310 and connected to a vessel 350, and a second gas inlet 365 can be coupled to the reaction chamber 310 and connected to a remote plasma source 360. In embodiments including remote plasma configurations, the delivery lines for the precursors and the radical species generated in the remote plasma source are separated. Hence, the precursors and the radical species do not substantially interact before reaching the substrate 330. It will be understood that in some implementations the gas lines may be reversed so that the vessel 350 may provide precursor gas flow through the second gas inlet 365 and the remote plasma source 360 may provide ions and radicals through the first gas inlet 355.

One or more radical species may be generated in the remote plasma source 360 and configured to enter the reaction chamber 310 via the second gas inlet 365. Any type of plasma source may be used in remote plasma source 360 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 360 can be the GAMMA®, manufactured by Lam Research Corporation of Fremont, California Another example of such a RF remote plasma source 360 can be the Astron®, manufactured by MKS Instruments of Wilmington, Massachusetts, which can be operated at 440 kHz and can be provided as a subunit bolted onto a larger apparatus for processing one or more substrates in parallel. In some embodiments, a microwave plasma can be used as the remote plasma source 360, such as the Astex®, also manufactured by MKS Instruments. A microwave plasma can be configured to operate at a frequency of 2.45 GHz. Gas provided to the remote plasma source may include hydrogen, nitrogen, oxygen, and other gases as mentioned elsewhere herein. In certain embodiments, hydrogen is provided in a carrier such helium. As an example, hydrogen gas may be provided in a helium carrier at a concentration of about 1-10% hydrogen.

The precursors can be provided in vessel 350 and can be supplied to the showerhead 320 via the first gas inlet 355. The showerhead 320 distributes the precursors into the reaction chamber 310 toward the substrate 330. The substrate 330 can be located beneath the showerhead 320. It will be appreciated that the showerhead 320 can have any suitable shape, and may have any number and arrangement of ports for distributing gases to the substrate 330. The precursors can be supplied to the showerhead 320 and ultimately to the substrate 330 at a controlled flow rate.

The one or more radical species formed in the remote plasma source 360 can be carried in the gas phase toward the substrate 330. The one or more radical species can flow through a second gas inlet 365 into the reaction chamber 310. It will be understood that the second gas inlet 365 need not be transverse to the surface of the substrate 330 as illustrated in FIG. 3. In certain embodiments, the second gas inlet 365 can be directly above the substrate 330 or in other locations. The distance between the remote plasma source 360 and the reaction chamber 310 can be configured to provide mild reactive conditions such that the ionized species generated in the remote plasma source 360 are substantially neutralized, but at least some radical species in substantially low energy states remain in the environment adjacent to the substrate 330. Such low energy state radical species are not recombined to form stable compounds. The distance between the remote plasma source 360 and the reaction chamber 310 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 310), and other factors. In some embodiments, the distance between the remote plasma source 360 and the reaction chamber 310 can be between about 1 cm and 30 cm, such as about 5 cm or about 15 cm.

In some embodiments, a co-reactant, which is not the primary silicon-containing precursor or a hydrogen radical, is introduced during the deposition reaction. In some implementations, the apparatus is configured to introduce the co-reactant through the second gas inlet 365, in which case the co-reactant is at least partially converted to plasma. In some implementations, the apparatus is configured to introduce the co-reactant through the showerhead 320 via the first gas inlet 355. Examples of the co-reactant include oxygen, nitrogen, ammonia, carbon dioxide, carbon monoxide, and the like. The flow rate of the co-reactant can vary over time to produce a composition gradient in a graded film.

Figure 4:
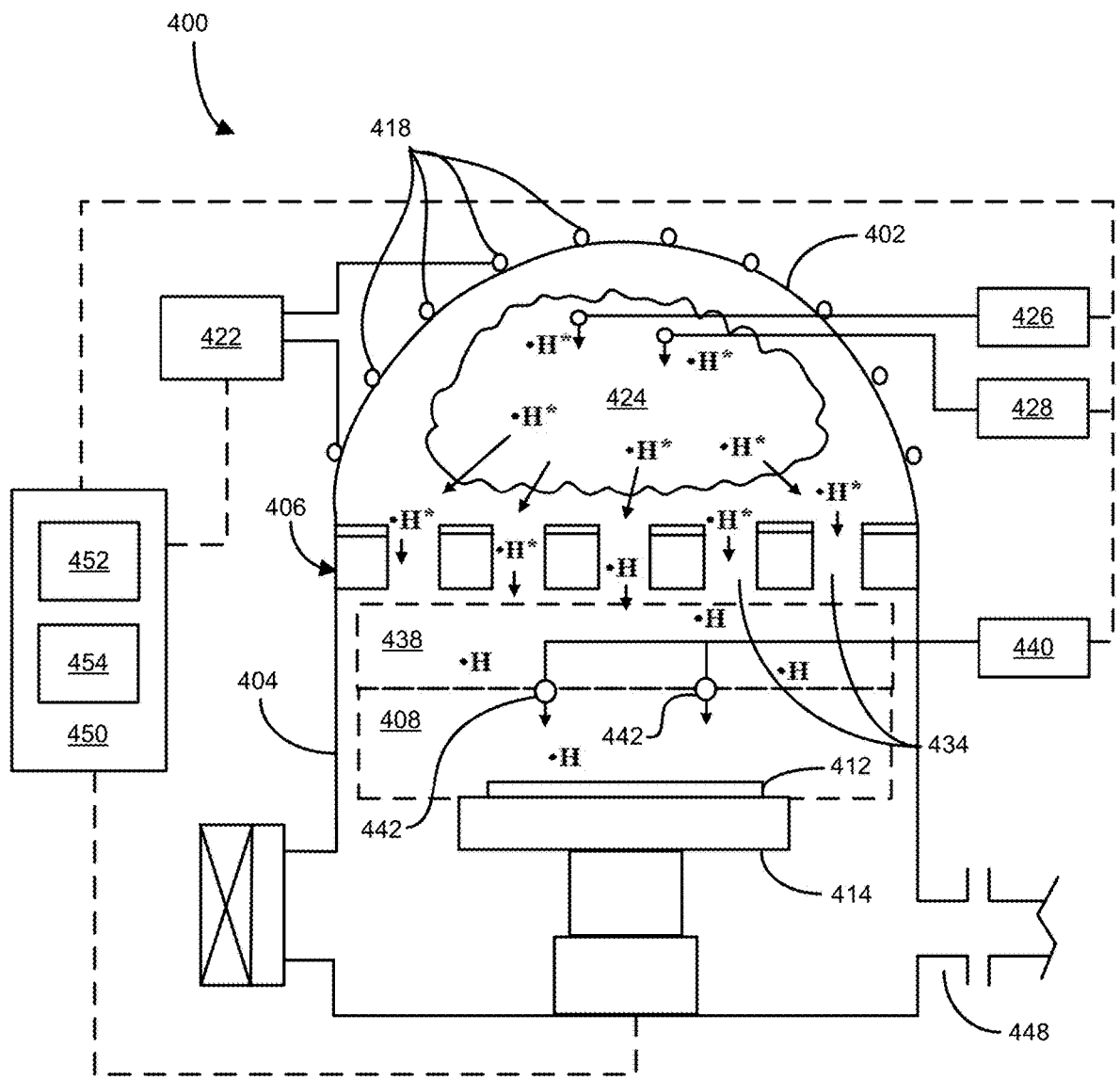
FIG. 4 illustrates a schematic diagram of an example plasma processing apparatus with a remote plasma source according to some other implementations.

FIG. 4 illustrates a schematic diagram of an example plasma processing apparatus with a remote plasma source according to some other implementations. The plasma processing apparatus 400 includes the remote plasma source 402 separated from a reaction chamber 404. The remote plasma source 402 is fluidly coupled with the reaction chamber 404 via a multiport gas distributor 406, which may also be referred to as a showerhead. Radical species are generated in the remote plasma source 402 and supplied to the reaction chamber 404. One or more silicon-containing precursors are supplied to the reaction chamber 404 downstream from the remote plasma source 402 and from the multiport gas distributor 406. The one or more silicon-containing precursors react with the radical species in a chemical vapor deposition zone 408 of the reaction chamber 404 to deposit a silicon carbide film on a surface of a substrate 412. The chemical vapor deposition zone 408 includes an environment adjacent to the surface of the substrate 412.

The substrate 412 is supported on a substrate support or pedestal 414. The pedestal 414 may move within the reaction chamber 404 to position the substrate 412 within the chemical vapor deposition zone 408. In the embodiment shown in FIG. 4, pedestal 414 is shown having elevated the substrate 410 within the chemical vapor deposition zone 408. The pedestal 414 may also adjust the temperature of the substrate 412 in some embodiments, which can provide some selective control over thermally activated surface reactions on the substrate 412.

FIG. 4 shows a coil 418 arranged around the remote plasma source 402, where the remote plasma source 402 includes an outer wall (e.g., quartz dome). The coil 418 is electrically coupled to a plasma generator controller 422, which may be used to form and sustain plasma within a plasma region 424 via inductively coupled plasma generation. In some implementations, the plasma generator controller 422 may include a power supply for supplying power to the coil 418, where the power can be in a range between about 1 and 6 kilowatts (kW) during plasma generation. In some implementations, electrodes or antenna for parallel plate or capacitively coupled plasma generation may be used to generate a continuous supply of radicals via plasma excitation rather than inductively coupled plasma generation. Regardless of the mechanism used to ignite and sustain the plasma in the plasma region 424, radical species may continuously be generated using plasma excitation during film deposition. In some implementations, hydrogen radicals are generated under approximately steady-state conditions during steady-state film deposition, though transients may occur at the beginning and end of film deposition.

A supply of hydrogen radicals may be continuously generated within the plasma region 424 while hydrogen gas or other source gas is being supplied to the remote plasma source 402. Excited hydrogen radicals may be generated in the remote plasma source 402. If not re-excited or re-supplied with energy, or re-combined with other radicals, the excited hydrogen radicals lose their energy, or relax. Thus, excited hydrogen radicals may relax to form hydrogen radicals in a substantially low energy state or ground state.

The hydrogen gas or other source gas may be diluted with one or more additional gases. These one or more additional gases may be supplied to the remote plasma source 402. In some implementations, the hydrogen gas or other source gas is mixed with one or more additional gases to form a gas mixture, where the one or more additional gases can include a carrier gas. Non-limiting examples of additional gases can include helium (He), neon (Ne), argon (Ar), krypton (Kr), xenon (Xe), and nitrogen ($N_2$). The one or more additional gases may support or stabilize steady-state plasma conditions within the remote plasma source 402 or aid in transient plasma ignition or extinction processes. In some implementations, diluting hydrogen gas or other source gas with helium, for example, may permit higher total pressures without concomitant plasma breakdown. Put another way, a dilute gas mixture of hydrogen gas and helium may permit higher total gas pressure without increasing plasma power to the remote plasma source 402. As shown in FIG. 4, a source gas supply 426 is fluidly coupled with the remote plasma source 402 for supplying the hydrogen gas or source gas. In addition, an additional gas supply 428 is fluidly coupled with the remote plasma source 402 for supplying the one or more additional gases. The one or more additional gases may also include a co-reactant gas as described above. While the embodiment in FIG. 4 depicts the gas mixture of the source gas and the one or more additional gases being introduced through separate gas outlets, it will be understood that the gas mixture may be introduced directly into the remote plasma source 402. That is, a pre-mixed dilute gas mixture may be supplied to the remote plasma source 402 through a single gas outlet.

Gases, such as excited hydrogen and helium radicals and relaxed gases/radicals, flow out of the remote plasma source 402 and into the reaction chamber 404 via multiport gas distributor 406. Gases within the multiport gas distributor 406 and within the reaction chamber 404 are generally not subject to continued plasma excitation therein. In some implementations, the multiport gas distributor 406 includes an ion filter and/or a photon filter. Filtering ions and/or photons may reduce substrate damage, undesirable re-excitation of molecules, and/or selective breakdown or decomposition of silicon-containing precursors within the reaction chamber 404. Multiport gas distributor 406 may have a plurality of gas ports 434 to diffuse the flow of gases into the reaction chamber 404. In some implementations, the plurality of gas ports 434 may be mutually spaced apart. In some implementations, the plurality of gas ports 434 may be arranged as an array of regularly spaced apart channels or through-holes extending through a plate separating the remote plasma source 402 and the reaction chamber 404. The plurality of gas ports 434 may smoothly disperse and diffuse exiting radicals from the remote plasma source 402 into the reaction chamber 404.

Typical remote plasma sources are far removed from reaction vessels. Consequently, radical extinction and recombination, e.g., via wall collision events, may reduce active species substantially. In contrast, in some implementations, dimensions for the plurality of gas ports 434 may be configured in view of the mean free path or gas flow residence time under typical processing conditions to aid the free passage of radicals into the reaction chamber 404. In some implementations, openings for the plurality of gas ports 434 may occupy between about 5% and about 20% of an exposed surface area of the multiport gas distributor 406. In some implementations, the plurality of gas ports 434 may each have an axial length to diameter ratio of between about 3:1 and 10:1 or between about 6:1 and about 8:1. Such aspect ratios may reduce wall-collision frequency for radical species passing through the plurality of gas ports 434 while providing sufficient time for a majority of excited state radical species to relax to ground state radical species. In some implementations, dimensions of the plurality of gas ports 434 may be configured so that the residence time of gases passing through the multiport gas distributor 406 is greater than the typical energetic relaxation time of an excited state radical species. Excited state radical species for hydrogen source gas may be denoted by •H* in FIG. 4 and ground state radical species for hydrogen source gas may be denoted by •H in FIG. 4.

In some implementations, excited state radical species exiting the plurality of gas ports 434 may flow into a relaxation zone 438 contained within an interior of the reaction chamber 404. The relaxation zone 438 is positioned upstream of the chemical vapor deposition zone 408 but downstream of the multiport gas distributor 406. Substantially all or at least 90% of the excited state radical species exiting the multiport gas distributor 406 will transition into relaxed state radical species in the relaxation zone 438. Put another way, almost all of the excited state radical species (e.g., excited hydrogen radicals) entering the relaxation zone 438 become de-excited or transition into a relaxed state radical species (e.g., ground state hydrogen radicals) before exiting the relaxation zone 438. In some implementations, process conditions or a geometry of the relaxation zone 438 may be configured so that the residence time of radical species flowing through the relaxation zone 438, e.g., a time determined by mean free path and mean molecular velocity, results in relaxed state radical species flowing out of the relaxation zone 438.

With the delivery of radical species to the relaxation zone 438 from the multiport gas distributor 406, one or more silicon-containing precursors and/or one or more co-reactants may be introduced into the chemical vapor deposition zone 408. The one or more silicon-containing precursors may be introduced via a gas distributor or gas outlet 442, where the gas outlet 442 may be fluidly coupled with a precursor supply source 440. The relaxation zone 438 may be contained within a space between the multiport gas distributor 406 and the gas outlet 442. The gas outlet 442 may include mutually spaced apart openings so that the flow of the one or more silicon-containing precursors may be introduced in a direction parallel with gas mixture flowing from the relaxation zone 438. The gas outlet 442 may be located downstream from the multiport gas distributor 406 and the relaxation zone 438. The gas outlet 442 may be located upstream from the chemical vapor deposition zone 408 and the substrate 412. The chemical vapor deposition zone 408 is located within the interior of the reaction chamber 404 and between the gas outlet 442 and the substrate 412.

Substantially all of the flow of the one or more silicon-containing precursors may be prevented from mixing with excited state radical species adjacent to the multiport gas distributor 406. Relaxed or ground state radical species mix in a region adjacent to the substrate 412 with the one or more silicon-containing precursors. The chemical vapor deposition zone 408 includes the region adjacent to the substrate 412 where the relaxed or ground state radical species mix with the one or more silicon-containing precursors. The relaxed or ground state radical species mix with the one or more silicon-containing precursors in the gas phase during CVD formation of a silicon carbide film.

In some implementations, a co-reactant may be introduced from the gas outlet 442 and flowed along with the one or more silicon-containing precursors. The co-reactant may include a carbon-containing precursor as described below. The co-reactant may be introduced downstream from the remote plasma source 402. The co-reactant may be supplied from the precursor supply source 440 or other source (not shown) fluidly coupled to the gas outlet 442. The co-reactant may be a carbon-containing precursor as described below. In some implementations, a co-reactant may be introduced from the multiport gas distributor 406 and flowed along with the radical species generated in the remote plasma source 402 and into the reaction chamber 404. This may include radicals and/or ions of a co-reactant gas provided in the remote plasma source 402. The co-reactant may be supplied from the additional gas supply 428.

The gas outlet 442 may be separated from the multiport gas distributor 406 by a sufficient distance to prevent back diffusion or back streaming of the one or more silicon-containing precursors. In some implementations, the gas outlet 442 may be separated from the plurality of gas ports 434 by a distance between about 0.5 inches and about 5 inches, or between about 1.5 inches and about 4.5 inches, or between about 1.5 inches and about 3 inches.

Process gases may be removed from the reaction chamber 404 via an outlet 448 configured that is fluidly coupled to a pump (not shown). Thus, excess silicon-containing precursors, co-reactants, radical species, and diluent and displacement or purge gases may be removed from the reaction chamber 404. In some implementations, a system controller 450 is in operative communication with the plasma processing apparatus 400. In some implementations, the system controller 450 includes a processor system 452 (e.g., microprocessor) configured to execute instructions held in a data system 454 (e.g., memory). In some implementations, the system controller 450 may be in communication with the plasma generator controller 422 to control plasma parameters and/or conditions. In some implementations, the system controller 450 may be in communication with the pedestal 414 to control pedestal elevation and temperature. In some implementations, the system controller 450 may control other processing conditions, such as RF power settings, frequency settings, duty cycles, pulse times, pressure within the reaction chamber 404, pressure within the remote plasma source 402, gas flow rates from the source gas supply 426 and the additional gas supply 428, gas flow rates from the precursor supply source 440 and other sources, temperature of the pedestal 414, and temperature of the reaction chamber 404, among others.

Aspects of the controller 450 of FIG. 4 described below also apply to the controller 340 of FIG. 3. The controller 450 may contain instructions for controlling process conditions for the operation of the plasma processing apparatus 400. The controller 450 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 450 or they may be provided over a network.

In certain embodiments, the controller 450 controls all or most activities of the plasma processing apparatus 400 described herein. For example, the controller 450 may control all or most activities of the plasma processing apparatus 400 associated with depositing a silicon carbide film and, optionally, other operations in a fabrication flow that includes the silicon carbide film. The controller 450 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 450 may be employed in some embodiments. To provide relatively mild reactive conditions at the environment adjacent to the substrate 412, parameters such as the RF power levels, gas flow rates to the plasma region 424, gas flow rates to the chemical vapor deposition zone 408, and timing of the plasma ignition can be adjusted and maintained by controller 450. Additionally, adjusting the substrate position may further reduce the presence of high-energy radical species at the environment adjacent to the substrate 412. In a multi-station reactor, the controller 450 may comprise different or identical instructions for different apparatus stations, thus allowing the apparatus stations to operate either independently or synchronously.

In some embodiments, the controller 450 may include instructions for performing operations such as flowing one or more silicon-containing precursors through the gas outlet 442 into the reaction chamber 404, providing a source gas into the remote plasma source 402, generating one or more radical species of the source gas in the remote plasma source 402, introducing the one or more radical species in a substantially low energy state from the remote plasma source 402 into the reaction chamber 404 to react with the one or more silicon-containing precursors to deposit a silicon carbide film on the substrate 412. The one or more radical species in the reaction chamber 404 in an environment adjacent to the substrate 412 may be hydrogen radicals in a ground state. In some implementations, the controller 450 may include instructions for flowing a co-reactant with the one or more silicon-containing precursors into the reaction chamber 404. The co-reactant may be a hydrocarbon molecule and each of the one or more silicon-containing precursors may have at least two hydrogen atoms bonded to a silicon atom.

In some embodiments, the apparatus 400 may include a user interface associated with controller 450. The user interface may include a display screen, graphical software displays of the apparatus 400 and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to the silicon carbide deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Remote Plasma CVD Using Silicon-Containing Precursor and Carbon-Containing Precursor Deposition of silicon carbide films, including silicon nitricarbide films, using ALD presents many challenges including thermodynamic challenges that can make ALD of silicon carbide films difficult to achieve. In addition, the deposition rate of ALD is slower compared to typical CVD techniques and may not be desirable in manufacturing processes. Moreover, incorporation of carbon into a silicon-based film or silicon nitride-based film can be very difficult without compromising characteristics of step coverage, film density, and/or film quality of the silicon carbide film. The present disclosure relates to deposition of silicon carbide film using remote plasma CVD. Incorporation of carbon into a silicon-based film or silicon nitride based-film can be achieved in the present disclosure without formation of any C—C bonds and N—C bonds. The presence of C—C or N—C bonds may have an adverse impact on the characteristics of a silicon carbide film.

As discussed above, the deposition reaction for depositing silicon carbide films may include a co-reactant in addition to the silicon-containing precursor and the radical species. Introduction of the co-reactant may serve to tune a composition of the silicon carbide film. The co-reactant may be flowed into a reaction chamber along with the silicon-containing precursor, where the co-reactant may be flowed downstream from a remote plasma source. For example, a gas outlet for introducing the silicon-containing precursor and the co-reactant may be positioned downstream from the remote plasma source. The remote plasma source is considered upstream from the substrate and the environment adjacent to the substrate. In some implementations, the gas outlet for introducing the silicon-containing precursor and the co-reactant may be positioned downstream from the remote plasma source and upstream from the substrate and the environment adjacent to the substrate.

The co-reactant may be introduced as a second precursor in addition to the silicon-containing precursor. The second precursor has a chemistry that serves to tune a composition of the silicon carbide film. In some implementations, the second precursor has a chemistry that serves to improve step coverage of the silicon carbide film. Step coverage of the deposited silicon carbide film may be measured with respect to one or more features of the substrate. "Features" as used herein may refer to a non-planar structure on the substrate, typically a surface being modified in a semiconductor device fabrication operation. Examples of features include trenches, vias, pads, pillars, domes, and the like. A feature typically has an aspect ratio (depth or height to width). In some implementations, the step coverage of the silicon carbide film is at least 75%, at least 80%, at least 85%, at least 90%, at least 95%, or at least 99%.

In some implementations, the co-reactant is a hydrocarbon molecule. The co-reactant of the present disclosure may also be referred to as a carbon-containing precursor that is flowed along with the silicon-containing precursor. In some implementations, the hydrocarbon molecule may be a small-chain hydrocarbon molecule with at least one double bond or at least one triple bond. For example, the hydrocarbon molecule includes a carbon chain between 3 carbon atoms and 7 carbon atoms. The hydrocarbon molecule may include one or more unsaturated carbon bonds, such as one or more carbon-to-carbon double bonds or triple bonds. Thus, the hydrocarbon molecule may include an alkene or alkyne group. Examples of suitable hydrocarbon molecules include propylene, ethylene, butene, pentene, butadiene, pentadiene (e.g., 1,4 pentadiene), hexadiene, heptadiene, toluene, and benzene. Additional examples of suitable hydrocarbon molecules include acetylene, propyne, butyne, pentyne (e.g., 1-pentyne), and hexyne (e.g., 2-hexyne).

The carbon-containing precursor is flowed along with one or more silicon-containing precursors. In some implementations, each of the silicon-containing precursors has no C—O bonds and no C—N bonds. Each of the silicon-containing precursors may include two or more Si—H bonds. In fact, each of the silicon-containing precursors has at least one silicon atom with two or more hydrogen atoms bonded to it. Accordingly, the at least one silicon atom does not have more than two carbon atoms, nitrogen atoms, and/or oxygen atoms bonded to it. Examples of the silicon-containing precursor include but are not limited to silanes and higher order silanes, or alkyl silanes and higher order alkyl silanes. For example, the silicon-containing precursor may be a silane, disilane, trisilane, methylsilane, or dimethylsilane. Thus, the silicon-containing precursor flowed along with the carbon-containing precursor may be a silane-based precursor. A silane-based precursor has a silicon atom with four substituents bonded to the silicon atom. Of the four substituents on the silicon atom, at least two of the substituents are hydrogen.

The carbon-containing precursor and the silicon-containing precursor are introduced into the reaction chamber downstream from one or more radical species. The radical species may be generated in a remote plasma source upstream from the gas outlet for introducing the carbon-containing precursor and the silicon-containing precursor. The radical species may include hydrogen radicals, where the hydrogen radicals are in a substantially low energy state or ground state upon mixing or interacting with the carbon-containing precursor and the silicon-containing precursor.

Most if not all Si—C bonds in a silicon carbide film may ordinarily be provided by existing Si—C bonds in the silicon-containing precursor when depositing the silicon carbide film by remote plasma CVD. This can limit an ability to tune a composition of the silicon carbide film. Flowing a co-reactant with the silicon-containing precursor may add greater flexibility in tuning the composition of the silicon carbide film so that more or less carbon may be incorporated in the silicon carbide film. However, where the co-reactant is a carbon-containing co-reactant, either the co-reactant does not contribute to composition tuning of the silicon carbide film or the co-reactant adds C—C bonds, C—O bonds, or C—N bonds that can adversely impact electrical characteristics and/or step coverage of the silicon carbide film. The carbon-containing co-reactant and the silicon-containing precursor are chosen in the present disclosure so that the carbon-containing co-reactant contributes to composition tuning of the silicon carbide film without adding C—C bonds, C—O bonds, or C—N bonds. The carbon-containing co-reactant and the silicon-containing precursor add an extra process knob for tuning the composition of the silicon carbide film while maintaining or improving a film quality compared to silicon carbide films deposited using existing Si—C bonds in the silicon-containing precursor.

Figure 5:
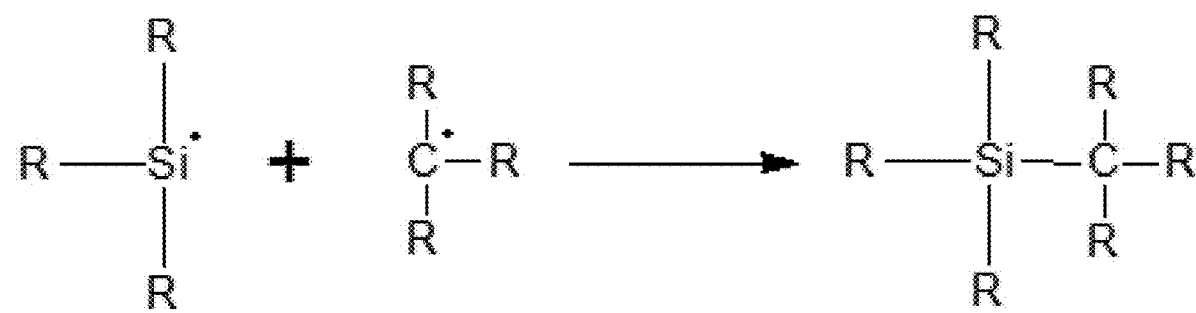
FIG. 5 shows an example of a chemical reaction between an activated alkane(s) from a carbon-containing precursor and an activated silane-based precursor.

Hydrogen radicals in a substantially low energy state or ground state may interact with the carbon-containing precursor and the silane-based precursor. Without being limited by any theory, one of the more kinetically favorable reaction mechanisms in the deposition reaction includes hydrogen abstraction, which involves selective breaking of Si—H bonds in the silane-based precursor. The hydrogen abstraction results in an activated silane-based precursor. Without being limited by any theory, the hydrogen radicals in the substantially low energy state or ground state may interact with the alkyne or alkene groups in the hydrocarbon molecule that results in the formation of activated alkanes (e.g., methane). In some instances, the hydrocarbon molecule breaks down into smaller-chain hydrocarbon molecules or radicals. The activated alkanes contain a carbon radical as an active site and the activated silane-based precursor contains a silicon radical as an active site, and these active sites can react together to form a Si—C bond. FIG. 5 shows an example of a chemical reaction between an activated alkane from a carbon-containing precursor and an activated silane-based precursor.

The carbon-containing precursor does not serve as a passive spectator, but can significantly contribute to the composition of the silicon carbide film. The carbon-containing precursor and byproducts of any reaction with the hydrogen radicals in the substantially low energy state or ground state may get incorporated in the silicon carbide film in a substantial amount. As used herein, a "substantial amount" with respect to incorporation of the carbon from the carbon-containing precursor in the silicon carbide film may refer to a change in atomic concentration of carbon by an amount equal to or greater than about 5% compared to deposition of the silicon carbide film without the carbon-containing precursor. The contribution of carbon from the carbon-containing precursor avoids or otherwise minimizes incorporation of C—C bonds. The silicon carbide film has no C—C bonds or substantially no C—C bonds. In some implementations, a percentage of C—C bonds in the silicon carbide film is equal to or less than about 2%, equal to or less than about 1%, equal to or less than about 0.5%, or even 0%.

The remote plasma CVD process in the present disclosure may include remote hydrogen plasma, with hydrogen radicals interacting with the carbon-containing precursor and the silicon-containing precursor downstream from a remote plasma source. In some implementations, the remote hydrogen plasma may further include remote nitrogen plasma or remote oxygen plasma. A nitriding agent or oxidizing agent may be added to the remote plasma source to generate nitrogen radicals or oxygen radicals, respectively. The nitriding agent may facilitate formation of silicon nitricarbide (SiCN) films and the oxidizing agent may facilitate formation of silicon oxycarbide (SiCO) films.

In forming SiCN films, a nitriding agent and hydrogen may be provided to the remote plasma source. In some implementations, a carrier gas such as helium is provided to the remote plasma source to mix with the nitriding agent and hydrogen. Radicals of the nitriding agent and hydrogen may be generated in the remote plasma source. In some implementations, the nitriding agent includes nitrogen ($N_2$) or ammonia ($NH_3$). The radicals of the nitriding agent may be introduced from the remote plasma source into the reaction chamber along a flow path of the radicals of hydrogen. The radicals of the nitriding agent and hydrogen react with the one or more silicon-containing precursors and the co-reactant to form SiCN films. Without being limited by any theory, amine radicals or nitrogen radicals interact with the activated silicon-containing precursor to form Si—N bonds. The SiCN films have no C—C bonds or substantially no C—C bonds, and no C—N bonds or substantially no C—N bonds. In some implementations, a percentage of C—C bonds or C—N bonds in the SiCN film is equal to or less than about 2%, equal to or less than about 1%, equal to or less than about 0.5%, or even 0%.

In forming SiCO films, an oxidizing agent and hydrogen may be provided to the remote plasma source. In some implementations, a carrier gas such as helium is provided to the remote plasma source to mix with the oxidizing agent and hydrogen. Radicals of the oxidizing agent and hydrogen may be generated in the remote plasma source. In some implementations, the oxidizing agent includes carbon dioxide ($CO_2$), carbon monoxide (CO), oxygen ($O_2$), ozone ($O_3$), or nitrous oxide ($N_2O$). The radicals of the oxidizing agent may be introduced from the remote plasma source into the reaction chamber along a flow path of the radicals of hydrogen. The radicals of the oxidizing agent and hydrogen react with the one or more silicon-containing precursors and the co-reactant to form SiCO films. Without being limited by any theory, oxygen radicals interact with the activated silicon-containing precursor to form Si—O bonds. The SiCO films have no C—C bonds or substantially no C—C bonds, and no C—O bonds or substantially no C—O bonds. In some implementations, a percentage of C—C bonds or C—O bonds in the SiCO film is equal to or less than about 2%, equal to or less than about 1%, equal to or less than about 0.5%, or even 0%.

Figure 6A:
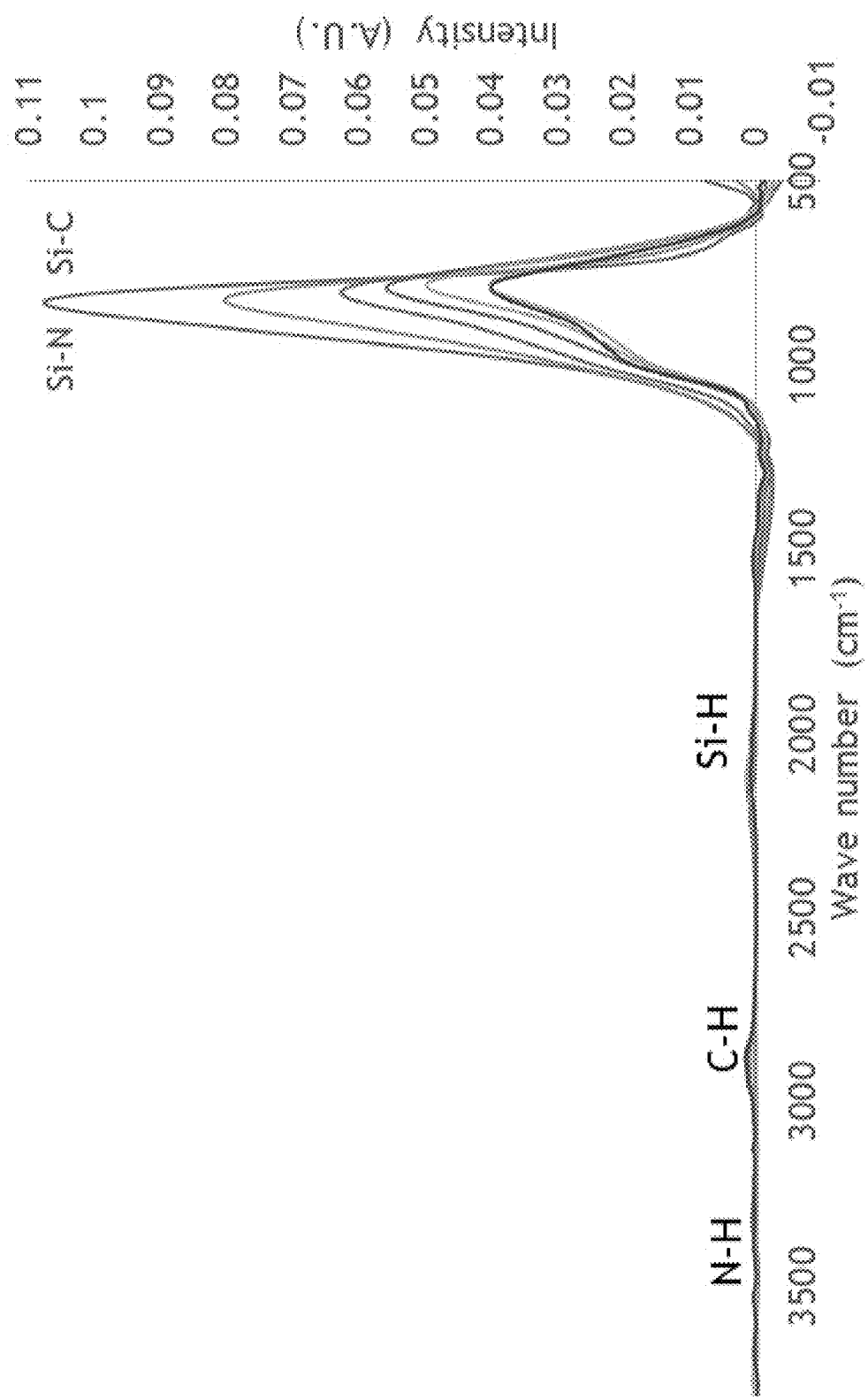
FIG. 6A shows a graph of FTIR spectra for remote plasma CVD of a silicon carbide film using a silicon-containing precursor and varying amounts of a carbon-containing precursor.
Figure 6B:
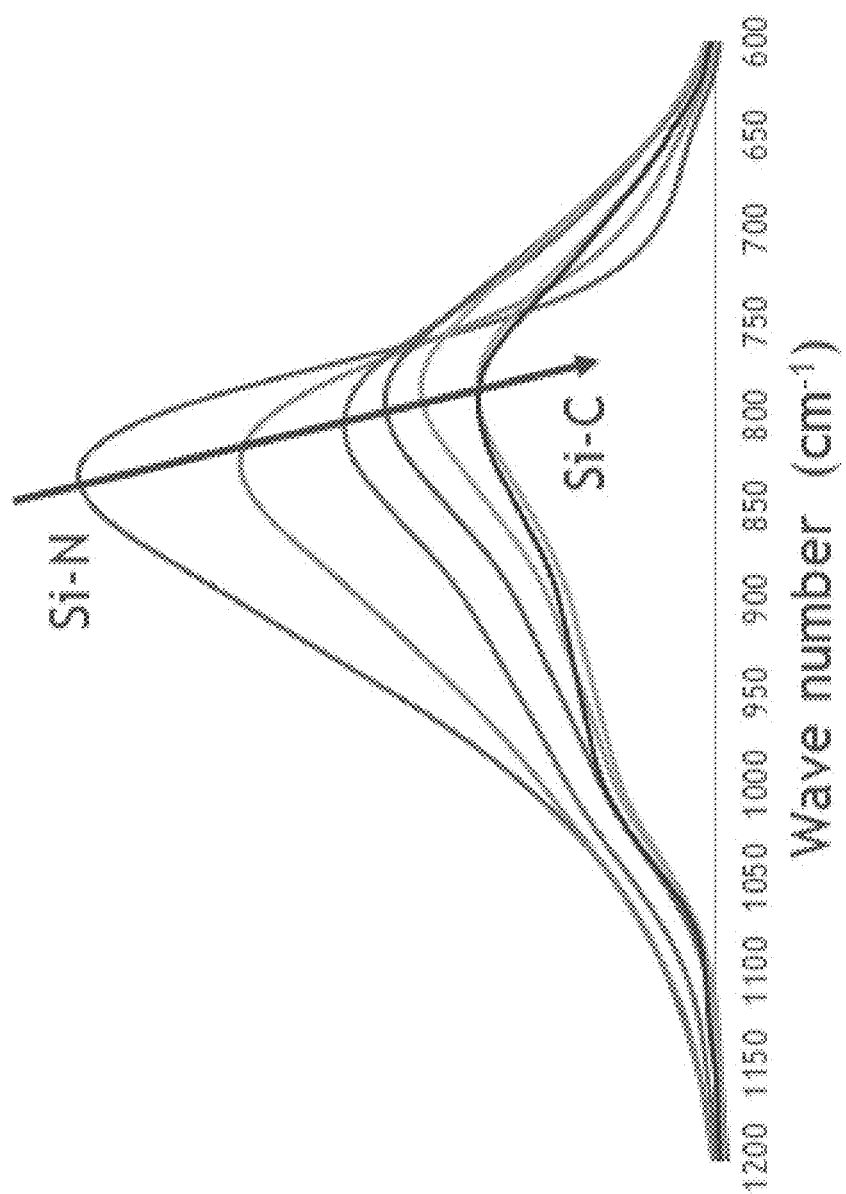
FIG. 6B shows a magnified view of a portion of the FTIR spectra in FIG. 6A.

FIG. 6A shows a graph of FTIR spectra for remote plasma CVD of a silicon carbide film using a silicon-containing precursor and varying amounts of a carbon-containing precursor. FIG. 6B shows a magnified view of a portion of the FTIR spectra in FIG. 6A. The carbon-containing precursor and the silicon-containing precursor are provided downstream from the remote plasma. The remote plasma includes hydrogen radicals and nitrogen radicals. In FIGS. 6A-6B, the FTIR spectra shows several plots, the plot with the tallest peak having a flow rate of 0 sccm of a carbon-containing precursor, the plot with the second-tallest peak having a flow rate of 1 sccm of the carbon-containing precursor, the plot with the third-tallest peak having a flow rate of 3 sccm of the carbon-containing precursor, the plot with the fourth-tallest peak having a flow rate of 5 sccm of the carbon-containing precursor, the plot with the fifth-tallest peak having a flow rate of 10 sccm of the carbon-containing precursor, the plot with the sixth-tallest peak having a flow rate of 15 sccm of the carbon-containing precursor, and the plot with the shortest peak having a flow rate of 24 sccm of the carbon-containing precursor. The presence of Si—N bonds can be observed at about 835 $cm^{-1}$ and the presence of Si—C bonds can be observed at about 790 $cm^{-1}$.

Without a carbon-containing precursor, a silicon nitride film is deposited when the silicon-containing precursor reacts with a remote plasma containing nitrogen radicals. The introduction of a carbon-containing precursor results in formation of a silicon nitricarbide film. The silicon nitricarbide film includes both Si—N bonds and Si—C bonds. As shown in FIGS. 6A-6B, increasing a flow rate of the carbon-containing precursor increases an amount of Si—C bonds in the silicon nitricarbide film. The Si—C bonds are a result of the carbon-containing precursor. Whereas the presence of Si—C bonds ordinarily comes from a single silicon-containing precursor, the present disclosure can introduce a silicon-containing precursor and a carbon-containing precursor to form Si—C bonds in a doped or undoped silicon carbide film.

Figure 7:
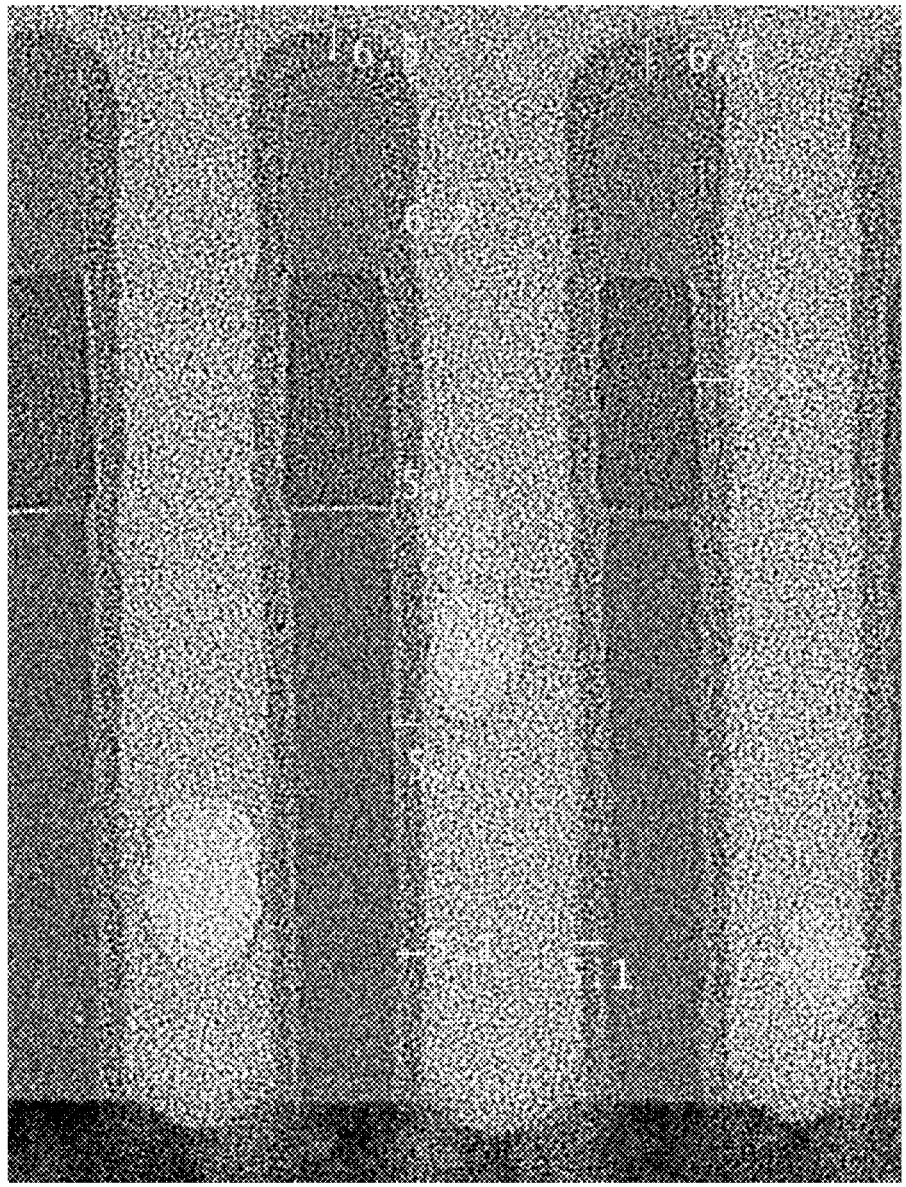
FIG. 7 shows a TEM image of a silicon carbide thin film deposited on substrate features using a silicon-containing precursor and a carbon-containing precursor.

FIG. 7 shows a TEM image of a silicon carbide thin film deposited on substrate features using a silicon-containing precursor and a carbon-containing precursor. The remote plasma includes hydrogen radicals and nitrogen radicals. X-ray photoelectron spectroscopy (XPS) data can identify a composition of a deposited film including the silicon carbide thin film in FIG. 7. A summary of XPS data compiled for the silicon carbide thin film is shown in Table 1. The elemental composition is expressed in terms of percentage atomic concentration, and atomic percentage ratios are expressed between carbon and silicon (C/Si), nitrogen and silicon (N/Si), and carbon and nitrogen (C/N). As shown in Table 1, introduction of a carbon-containing precursor can produce a doped silicon carbide film with high carbon content.

TABLE 1

| | Si (at. %) | O (at. %) | C (at. %) | F (at. %) | N (at. %) | C/Si | N/Si | C/N |
|---|---|---|---|---|---|---|---|---|
| SiCN | 31.7 | 7.5 | 51.4 | 0.6 | 8.9 | 1.62 | 0.28 | 5.78 |

Introduction of a second precursor, particularly a carbon-containing precursor, significantly improves the step coverage of a silicon carbide film. In some implementations, the step coverage of the silicon carbide film is at least 75%, at least 80%, at least 85%, or at least 90%. Film quality and film density are also substantially preserved with the introduction of the carbon-containing precursor. For example, the film density can be equal to or greater than about 2.0 g/cm$^3$.

Structure and Properties of the Deposited Film

The deposited film will include silicon, carbon, and in some cases oxygen, nitrogen, and/or one or more other elements. In some embodiments, the atomic concentration of silicon is between about 15% and 45% (or about 25% to 40%), the atomic concentration of carbon is between about 10% and 50%, the atomic concentration of oxygen is between about 0% and 45%, and the atomic concentration of nitrogen is between about 0% and 45%. In one example, the atomic concentration of silicon is about 30%, the atomic concentration of oxygen is about 25%, and the atomic concentration of carbon is about 45%. In another example, the atomic concentration of silicon is about 30%, the atomic concentration of oxygen is about 45%, and the atomic concentration of carbon is about 25%. In another example, the film contains about 10-15% carbon and about 30-40% oxygen, both on an atomic basis. In all cases, the film contains some hydrogen. However, it will be understood that the relative atomic concentration of hydrogen will be small, e.g., equal to or less than about 5%. It will be understood that the relative atomic concentrations can vary depending on the choice of the precursor. The silicon atoms will form bonds with carbon and optionally nitrogen and/or oxygen atoms. In some embodiments, the deposited film contains more Si—C bonds than Si—N bonds. In some examples, the deposited film contains a ratio of Si—C bonds to Si—N bonds that is between about 0.5:1 and 3:1. In certain embodiments, the film density is between about 2 and 2.7 g/cm$^3$.

In employing a carbon-containing precursor and a silicon-containing precursor with at least two hydrogen atoms bonded to a silicon atom, the relative atomic concentrations of silicon and carbon may be relatively high compared to other elements in the silicon carbide film. In some implementations, the relative atomic concentration of silicon may be at least 25% or at least 30%, and the relative atomic concentration of carbon may be at least 25% or at least 30% or at least 40%. Furthermore, with respect to doped silicon carbide films, the relative atomic concentration of oxygen may be less than about 10% and the relative atomic concentration of nitrogen may be less than about 10%.

In some embodiments, the internal structure of the precursor is maintained in the deposited film. This structure may preserve all or most of the Si—C, and Si—O and/or Si—N bonds, if present, in the precursor, while linking or cross-linking individual precursor moieties through bonds at locations where Si—H bonds and/or Si—Si bonds existed in the precursor molecules and/or through additional condensation reactions on the growing surface if sufficient thermal energy is provided.

The process conditions described earlier herein can provide a film structure that is highly conformal. The relatively mild process conditions can minimize the degree of ion bombardment at the surface of the substrate so that the deposition lacks directionality. Moreover, the relatively mild process conditions can reduce the number of radicals with high sticking coefficients that would have a tendency to stick to the sidewalls of previously deposited layers or films. In certain embodiments, for an aspect ratio of about 2:1 to 10:1, the silicon carbide film may be deposited with a conformality of between about 25% and 100%, more typically between about 50% and 100%, and even more typically between about 80% and 100%. Conformality may be calculated by comparing the average thickness of a deposited film on a bottom, sidewall, or top of a feature to the average thickness of a deposited film on a bottom, sidewall, or top of a feature. For example, conformality may be calculated by dividing the average thickness of the deposited film on the sidewall by the average thickness of the deposited film at the top of the feature and multiplying it by 100 to obtain a percentage. For certain applications, a conformality of between about 85% and 95% is sufficient. In some examples depositing silicon carbide on features having an aspect ratio of between about 2:1 and about 4:1, the conformality is at least about 90%. Certain BEOL (back end of line) processes fall into this category. In some examples depositing silicon carbide on features having an aspect ratio of between about 4:1 and about 6:1, the conformality is at least about 80%. Certain spacer deposition processes fall into this category. In some examples depositing silicon carbide on features having an aspect ratio of between about 7:1 and about 10:1 (and even higher), the conformality is at least about 90%. Certain DRAM (dynamic random access memory) fabrication processes fall into this category.

The process conditions can also provide a film structure with a high breakdown voltage and a low leakage current. By introducing a limited amount of oxygen or nitrogen into a SiC class of material, leakage paths provided by Si—H bonds and/or Si—CH$_2$—Si bonds may be blocked by oxygen or nitrogen. The mode of conduction may be different in Si—O and Si—N at low fields. This can provide improved electrical properties while maintaining a relatively low dielectric constant. In various embodiments, the film has an effective dielectric constant of about 5 or lower, or about 4.0 or lower, and in some cases about 3.5 or lower, and some cases about 3.0 or lower, and in still other implementations about 2.5 or lower. The effective dielectric constant can depend on the bonding and density. In certain embodiments, SiOC films are made with a dielectric constant of 6 or greater, particularly when the carbon content is relatively high. If leakage current is an important consideration, SiOC needs to be <5. The lower you go, the worse will be its hermetic and barrier and thermal resistance properties. In some embodiments, where applications demand low hermeticity and diffusion limits, excellent etch resistance, thermal stability etc., the silicon carbide film may be made dense and highly cross-linked. This can be accomplished by, for example, a) depositing the film at a relatively high temperature, and/or b) providing a relatively high radicals:precursor ratio. In some embodiments, the silicon carbide film can be relatively thin and yet serve as an effective hermetic or diffusion barrier.

In some embodiments, the deposited film can be porous. As discussed earlier herein, the silicon-containing precursors can include cyclic siloxanes and caged siloxanes. These precursors, and others that have significant interior open space, can introduce significant porosity into the structure of the deposited film. Porosity in the deposited film can further lower the dielectric constant. In some embodiments, the porosity of the deposited silicon carbide film is between about 20% and 50%. The pore size of porous film may track that of the cyclic or caged precursor. In certain embodiments, the film's average pore size is between about 5 Å and 20 Å, such as about 16 Å.

Applications

The present disclosure may be further understood by reference to the following applications for high-quality silicon carbide films, which applications are intended to be purely illustrative. The present disclosure is not limited in scope by the specified applications, which are simply illustrations of aspects of the present disclosure.

In some embodiments, a silicon carbide film may be deposited over exposed copper. In some embodiments in depositing the silicon carbide film, reaction conditions adjacent to the substrate can be free of oxidants, such as $O_2$, $O_3$, and $CO_2$, including radicals thereof. Thus, the silicon carbide film may be deposited directly over the exposed copper without oxidizing copper (e.g., creating cupric oxide). Such films can serve as etch stop layers, which can also serve as copper diffusion barriers. The presence of the silicon carbide film can provide a sufficiently low dielectric constant with excellent leakage properties to serve as a diffusion barrier. The silicon carbide film can be an etch stop and/or diffusion barrier either by itself or as a bilayer stack (e.g., SiCO/SiNC bilayer deposited over exposed copper). In some embodiments, the silicon carbide film can be placed in between adjacent metallization layers that are typically produced by a damascene process. The silicon carbide film can resist etching and can be sufficiently dense to minimize the diffusion of copper ions into adjacent regions of dielectric material. In some embodiments, nitrogen may be incorporated into the film by employing nitrogen-containing precursors or plasma activating nitrogen-containing radicals, such as elemental nitrogen radicals or amine radicals.

In some embodiments as shown in FIG. 1B, a silicon carbide film 111 can be conformally deposited on features 112 of a substrate 110. The features 112 can be isolated or dense features, where the features 112 can have relatively small critical dimensions (CD). In some embodiments, the features can have a CD that is equal to or less than about 20 nm, equal to or less than about 10 nm, or equal to or less than about 5 nm. The height to width aspect ratio of the features 112 can be greater than 2:1, greater than 5:1, greater than 10:1, or greater than 20:1. The step coverage of the silicon carbide film 111 deposited on the features 112 is at least 75%, at least 80%, at least 85%, at least 90%, at least 95%, or at least 99%.

In some embodiments, silicon carbide film may be deposited as vertical structures adjacent to metal or semiconductor structures. Deposition of silicon carbide provides excellent step coverage along sidewalls of metal or semiconductor structures to create the vertical structures. In certain embodiments, the vertical structures may be referred to as spacers or liners.

FIG. 1C illustrates a cross-section of silicon carbide liners deposited on the sidewalls of a gate electrode structure of a transistor. As illustrated in FIG. 1C, the transistor can be a CMOS transistor with a silicon substrate 120 having a source 122 and a drain 123. A gate dielectric 124 can be deposited over the silicon substrate 120, and a gate electrode 125 can be deposited over the gate dielectric 124 to form the transistor. Silicon carbide spacers or liners 121 can be deposited on the sidewalls of the gate electrode 125 and gate dielectric 124.

In another example, FIG. 1D illustrates a cross-section of silicon carbide deposited on sidewalls of exposed copper lines in an air gap type metallization layer. Air gaps 130 can be introduced into an integrated circuit layer between copper lines 132 that can reduce the effective k-value of the layer. Silicon carbide liners 131 can be deposited on the sidewalls of the copper lines 132, and a nonconformal dielectric layer 133 can be deposited on the air gaps 130, liners 131, and copper lines 132. Examples of such air gap type metallization layers can be described in U.S. Patent Application Publication No. 2004/0232552 to Fei Wang et al., which is herein incorporated by reference in its entirety and for all purposes.

In some embodiments, a silicon carbide film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines.

FIG. 1E illustrates a cross-section of silicon carbide film as a pore sealant for porous dielectric materials. A porous dielectric layer 142 can have a plurality of trenches or vias cut into the porous dielectric layer 142 to form pores 140. Silicon carbide film 141 can be deposited along the pores 140 to effectively seal the pores 140. Sealing the pores 140 with the silicon carbide film 141 can avoid damaging the porous dielectric layer 142 that may otherwise be incurred by other sealing techniques using a plasma. The silicon carbide film 141 can be sufficiently dense as a pore sealant. In some embodiments, an etched dielectric material such as the porous dielectric layer 142 may first be treated by a "k-recovery" process, which exposes the porous dielectric layer 142 to UV radiation and a reducing agent. This recovery process is further described in commonly owned U.S. Patent Application Publication No. 2011/0111533 to Varadarajan et al., which is incorporated by reference herein in its entirety and for all purposes. In another "k-recovery" process, the porous dielectric layer 142 can be exposed to UV radiation and a chemical silylating agent. This recovery process is further described in commonly owned U.S. Patent Application Publication No. 2011/0117678 to Varadarajan et al., which is incorporated by reference herein in its entirety and for all purposes. After exposing the pores 140 to the recovery treatment, which makes the surface more hydrophilic and provides a monolayer of material, a layer of conformally deposited silicon carbide film 141 can be deposited to effectively seal the pores 140 of the porous dielectric layer 142.

In some embodiments, a silicon carbide film may be deposited as an ultra low-k dielectric material itself. Ultra low-k dielectrics are conventionally defined as those materials that have a dielectric constant lower than that of 2.5. In such configurations, the ultra low-k dielectric material of silicon carbide can be a porous dielectric layer. The pores of the dielectric layer can be introduced by using cyclic or caged precursor molecules, including the cyclic siloxanes and silsesquioxanes. In one example, the porosity of the ultra low-k dielectric layer of silicon carbide can be between about 20% and 50%. Further, the ultra low-k dielectric layer can have an average pore size of less than about 100 Å, such as between about 5 Å and 20 Å. For example, a cyclosiloxane ring can have a radius of about 6.7 Å. While increasing the number and size of the pores can lower the dielectric constant, the mechanical integrity of the dielectric layer can be compromised if it is too porous.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing a silicon carbide film on a substrate, the method comprising:
providing a substrate having one or more recessed features in a reaction chamber;
flowing a silicon-containing precursor into the reaction chamber towards the substrate, wherein the silicon-containing precursor has at least two hydrogen atoms bonded to a silicon atom;
flowing a co-reactant into the reaction chamber along with the silicon-containing precursor along a flow path without exposure to plasma, wherein the silicon-containing precursor and co-reactant are flowed into the reaction chamber via one or more gas outlets downstream from a remote plasma source, wherein the co-reactant is a hydrocarbon molecule;
generating, from a hydrogen source gas, radicals of hydrogen in the remote plasma source that are generated upstream of the silicon-containing precursor and the co-reactant; and
introducing continuously the radicals of hydrogen into the reaction chamber and towards the substrate, wherein the radicals of hydrogen are in a ground state to react with the silicon-containing precursor and the co-reactant in a chemical vapor deposition (CVD) reaction to form a doped or undoped silicon carbide film on the substrate having a conformality between 80% and 100% in the one or more recessed features of the substrate.

2. The method of claim 1, wherein the radicals of hydrogen in an environment adjacent to the substrate are radicals of hydrogen in the ground state.

3. The method of claim 1, wherein the hydrocarbon molecule has one or more carbon-to-carbon double bonds or triple bonds.

4. The method of claim 3, wherein the hydrocarbon molecule includes propylene, ethylene, butene, pentene, butadiene, pentadiene, hexadiene, heptadiene, toluene, benzene, acetylene, propyne, butyne, pentyne, or hexyne.

5. The method of claim 1, wherein the silicon-containing precursor is a silane, disilane, trisilane, methylsilane, or dimethylsilane.

6. The method of claim 1, wherein the silicon-containing precursor with at least two hydrogen atoms bonded to the silicon atom does not have more than two carbon atoms, nitrogen atoms, and/or oxygen atoms bonded to the silicon atom.

7. The method of claim 1, wherein a percentage of the C—C bonds in the silicon carbide film is equal to or less than 1% of the bonds in the doped or undoped silicon carbide film.

8. The method of claim 1, further comprising:
providing a nitriding agent along with the hydrogen source gas in the remote plasma source, wherein radicals of the nitriding agent are generated in the remote plasma source; and
introducing the radicals of the nitriding agent along with the radicals of hydrogen into the reaction chamber and towards the substrate, wherein the radicals of the nitriding agent and hydrogen react with the silicon-containing precursor and the co-reactant to form a silicon carbonitride (SiCN) film.

9. The method of claim 8, wherein the SiCN film has no C—C bonds or no C—C bonds, and no C—N bonds or no C—N bonds.

10. The method of claim 8, wherein the nitriding agent includes nitrogen ($N_2$) or ammonia ($NH_3$).

11. The method of claim 1, further comprising:
providing an oxidizing agent along with the hydrogen source gas in the remote plasma source, wherein radicals of the oxidizing agent are generated in the remote plasma source; and
introducing the radicals of the oxidizing agent along with the radicals of hydrogen into the reaction chamber and towards the substrate, wherein the radicals of the oxidizing agent and hydrogen react with the silicon-containing precursor and the co-reactant to form a silicon oxycarbide (SiCO) film.

12. The method of claim 11, wherein the SiCO film has no C—C bonds or no C—C bonds, and no C—O bonds or no C—O bonds.

13. The method of claim 11, wherein the oxidizing agent includes carbon dioxide ($CO_2$), carbon monoxide (CO), oxygen ($O_2$), ozone ($O_3$), or nitrous oxide ($N_2O$).

14. The method of claim 1, wherein the silicon-containing precursor is a silane-based precursor and the co-reactant is a carbon-containing precursor with one or more carbon-to-carbon double bonds or triple bonds.

15. The method of claim 1, wherein each of the one or more recessed features has an aspect ratio of at least 10:1.

16. The method of claim 1, wherein the silicon carbide film is undoped silicon carbide (SiC).

17. The method of claim 1, wherein an atomic concentration of silicon in the doped or undoped silicon carbide film is at least 25%, and wherein an atomic concentration of carbon in the doped or undoped silicon carbide film is at least 25%.

18. The method of claim 1, wherein the silicon-containing precursor has (i) no C—O bonds, and (ii) no C—N bonds.

* * * * *